US008685812B2

(12) United States Patent
Chi

(10) Patent No.: US 8,685,812 B2
(45) Date of Patent: Apr. 1, 2014

(54) LOGIC SWITCH AND CIRCUITS UTILIZING THE SWITCH

(71) Applicant: Taiwan Semiconductor Manufacturing Company, Ltd., Hsin-Chu (TW)

(72) Inventor: Min-Hwa Chi, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/731,744

(22) Filed: Dec. 31, 2012

(65) Prior Publication Data

US 2013/0143370 A1    Jun. 6, 2013

Related U.S. Application Data

(60) Continuation of application No. 12/611,360, filed on Nov. 3, 2009, now Pat. No. 8,362,528, which is a division of application No. 10/916,190, filed on Aug. 11, 2004, now Pat. No. 7,635,882.

(51) Int. Cl.
*H01L 29/94* (2006.01)

(52) U.S. Cl.
USPC ........... 438/199; 257/274; 257/279; 257/368; 257/369; 257/272; 438/218; 438/237

(58) Field of Classification Search
USPC .......... 438/151, 153, 199, 218, 237; 257/272, 257/274, 279, 368, 369
See application file for complete search history.

(56) References Cited

U.S. PATENT DOCUMENTS

| | | |
|---|---|---|
| 4,229,756 A | 10/1980 | Sato et al. |
| 5,480,820 A | 1/1996 | Roth et al. |
| 5,806,054 A | 9/1998 | Bergemont et al. |
| 6,133,780 A | 10/2000 | Chi |
| 6,144,075 A | 11/2000 | Chi |
| 6,281,550 B1 | 8/2001 | Chi |
| 6,407,425 B1 | 6/2002 | Babcock et al. |
| 6,552,397 B1 | 4/2003 | Chi |
| 6,809,380 B2 | 10/2004 | Matsuhashi |
| 7,635,882 B2 | 12/2009 | Chi |
| 2001/0013610 A1 | 8/2001 | Chi et al. |
| 2002/0074599 A1 | 6/2002 | Chi |
| 2003/0146474 A1 | 8/2003 | Ker et al. |
| 2004/0084689 A1 | 5/2004 | Chi |
| 2004/0135204 A1 | 7/2004 | Wang et al. |
| 2004/0245577 A1 | 12/2004 | Bhattacharyya |
| 2004/0251493 A1 | 12/2004 | Kitaguchi |
| 2005/0145895 A1 | 7/2005 | Luk et al. |

OTHER PUBLICATIONS

Wolf, S., et al., "Silicon Processing for the VLSI Era, vol. 3—The Submicron MOSFET," Lattice Press, 1995, pp. 198-200.

(Continued)

*Primary Examiner* — Daniel Whalen
*Assistant Examiner* — Suberr Chi
(74) *Attorney, Agent, or Firm* — Slater & Matsil, L.L.P.

(57) ABSTRACT

A logic switch intentionally utilizes GIDL current as its primary mechanism of operation. Voltages may be applied to a doped gate overlying and insulated from a pn junction. A first voltage initiates GIDL current, and the logic switch is bidirectionally conductive. A second voltage terminates GIDL current, but the logic switch is unidirectionally conductive. A third voltage renders the logic switch bidirectionally nonconductive. Circuits containing the logic switch are also described. These circuits include inverters, SRAM cells, voltage reference sources, and neuron logic switches. The logic switch is primarily implemented according to SOI protocols, but embodiments according to bulk protocols are described.

20 Claims, 25 Drawing Sheets

(56) References Cited

OTHER PUBLICATIONS

Lindert, N., et al., "Comparison of GIDL in p+-poly PMOS and n+-poly PMOS Devices," IEEE Electron Device Letters, vol. 17, No. 6, Jun. 1996, pp. 285-287.

Shibata, T., et al., "An Intelligent MOS Transistor Featuring Gate-Level Weighted Sum and Threshold Operations," IEDM, 1991, pp. 919-922.

Gray, et al., "Analysis and Design of Analog Integrated Circuits," Chapter 12, Section 12.3, 1984, pp. 730-737.

LOGIC SWITCH AND CIRCUITS UTILIZING THE SWITCH

This application is a continuation of U.S. patent application Ser. No. 12/611,360, entitled "Logic Switch and Circuits Utilizing the Switch," filed on Nov. 3, 2009, which is a divisional of U.S. Pat. No. 7,635,882, entitled "Logic Switch and Circuits Utilizing the Switch," filed on Aug. 11, 2004 and issued on Dec. 22, 2009, which are incorporated herein by reference.

TECHNICAL FIELD

The present invention relates to a logic switch and to various circuits utilizing such a switch. More specifically, the present invention relates to a logic switch implemented as a single- and multi-gated diode utilizing the GIDL effect and to GIDL gated diode-containing circuits, such as inverters, voltage references, SRAMs and neuron circuits.

BACKGROUND

Low power integrated circuits ("ICs"), such as MOSFETs, are increasingly important due to the growing demand for battery-operated portable devices, such as cell phones. Long battery life requires minimal current flow, ideally no current flow, during the time the MOSFETs are "off" to minimize or eliminate unnecessary power consumption. FETs experience various types of undesirable "off" currents, including sub-threshold currents, punch-through currents, oxide leakage currents, and currents caused by the Gate-Induced Drain Leakage ("GIDL") effect, all of which result in undesirable current flow during MOSFET "off" times. The GIDL effect also deleteriously affects data retention time of DRAM arrays made up of MOSFETs.

Various studies of GIDL and its causes have been conducted. See, for example: "Comparison of GIDL in p+-poly PMOS and n+-poly PMOS Devices, by Lindert, et al., in *IEEE Electron Device Letters*, Vol. 17, No. 6, June 1996, pages 285-287; *Silicon Processing for the VLSI Era*, by Wolf, Vol. 3 ("The Submicron MOSFET"), Lattice Press, 1995, pages 198-200; Commonly assigned U.S. Pat. No. 6,144,075, issued Nov. 7, 2000, to the present inventor (the "'075" patent); and materials cited in the foregoing.

The '075 patent discloses a CMOS inverter implemented in and on a bulk substrate. Although past efforts have been directed towards eliminating GIDL, the '075 patent's inverter utilizes, rather than avoids, GIDL. Although the inverter of that patent has an integrated, MOS-like structure having a small layout, its operation is not based on the typical "MOS action," i.e., action involving surface inversion and channel current.

A primary cause of GIDL is band-to-band tunneling that occurs at the substrate surface of a junction—source/substrate junction or drain/substrate junction—which is overlapped or overlain by a gate or a portion thereof. In a typical MOSFET, GIDL more commonly refers to unwanted "off" current associated with the drain/substrate junction.

The gate of an MOSFET is made up of a conductive gate electrode formed on a thin gate dielectric (usually an oxide) layer, which insulates the electrode from each junction and the intervening channel. A sufficiently large potential difference between the gate electrode and a drain, with the same polarity at the gate electrode as the majority carriers of the drain, results in a vertical field—i.e., a field that is across the gate oxide and is generally normal to the gate-substrate and gate-drain interfaces—that effects band bending at and near the conjunction of the interfaces. Band bending in the drain causes the minority carriers in the drain to tunnel from the valence band to the conduction band. A depletion region forms in the drain immediately subjacent to the gate oxide, and an inversion layer attempts to form at the surface of the drain adjacent the gate oxide. However, as minority carriers arrive at the drain surface to form the inversion layer, they immediately move, or are "swept," to the substrate, which is a region of lower potential for them. As the minority carriers flow into the substrate, the resulting flow of excess majority carriers results in a leakage current, i.e., GIDL.

Voltage reference circuits utilizing MOSFETs are known, as shown, for example, in *Analysis and Design of Analog Integrated Circuits*, by Gray and Meyer, published by John Wiley and Sons (1984), pages 730-737 ("Gray and Meyer"). Specifically, Gray and Meyer describe a 5-FET threshold-voltage-referenced ($V_t$-referenced), self-biased reference circuit (FIG. 12.25a on page 732), noting that the circuit suffers from the fact that the threshold voltage of most MOSFETs is not particularly well controlled and the output has a large negative temperature coefficient. As an alternative to this circuit, Gray and Meyers describe a 2-MOSFET $\Delta V_t$-referenced circuit (FIG. 12.25b on page 732). The 2-MOSFET circuit uses the difference between $V_t$ of two conventional FETs of the same polarity, but having different channel implants (e.g., enhancement-mode and depletion-mode, or, unimplanted enhancement-mode and implanted enhancement mode) and different $V_t$'s.

Neuron-MOSFETs (or v-MOSFETs) are known. See the following U.S. Pat. No. 6,407,425 to Babcock, et al.; U.S. Pat. No. 5,806,054 to Bergemont, et al.; and U.S. Pat. No. 5,480,820 to Roth, et al. Also see "An Intelligent MOS Transistor Featuring Gate-Level Weighted and Threshold Operations," by Shibata and Ohmi, in the proceedings of the 1991 International Electron Devices Meeting, pages 36.1.1 through 36.1.4. In addition to the foregoing, commonly assigned U.S. Pat. No. 6,133,780 to the inventor hereof shows a digitally tunable voltage reference using a neuron-MOSFET (the "'780 patent").

A neuron-MOSFET includes a typical MOSFET having a source and a drain with an intervening channel. A conventional gate is formed over the channel by overlaying a gate oxide superjacent to the channel with a conductive electrode layer. The electrode layer extends laterally away from the MOSFET, where it is enlarged.

Two or more (1, 2 . . . N) separated, side-by-side, conductive input layers overlie the enlarged electrode layer extension and are separated therefrom by insulative layers, so that voltages (V) applied to the input layers are capacitively coupled to the enlarged electrode layer. The area, $A_1, A_2 \ldots A_N$, of each input layer may differ from the others, or some or all may have the same area. The coupling area ($A_{C1}, A_{C2} \ldots A_{CN}$) of each input layer is the area of each input layer that is capacitively coupled with the enlarged electrode layer. The total area of the enlarged extension is much larger than the area of the gate electrode overlying the channel of the FET, and the total area of the enlarged electrode layer that is capacitively coupled to the input layers is $A_{CT}=A_{C1}+A_{C2}+ \ldots A_{CN}$.

A coupling ratio is defined as $R=A_C/A_{CT}$, that is, $R_1=A_{C1}/A_{CT}, R_2=A_{C2}/A_{CT}, \ldots R_N=A_{CN}/A_{CT}$, and $R_1+R_2+ \ldots R_N=1$. The potential $V_g$ of the gate electrode is the weighted sum of input voltages applied to the input layers, i.e., $V_g=V_1R_1+V_2R_2+ \ldots V_NR_N$. When $V_g$ is sufficiently high, the neuron-MOSFET turns "on," and it may be said to be "fired." A neuron-MOSFET, therefore, operates in an "if sufficient weighted sum, then fire" mode, a function that is relatively difficult to achieve with conventional static logic circuits, and which is said to mimic the "firing" of a neuron in the human brain.

The '780 patent describes a voltage reference circuit, after Gray and Meyer, substituting a neuron-MOSFET for one of the conventional MOSFETs. If the threshold voltage of the neuron-MOSFET and the conventional MOSFET are substantially the same, the output $V_o$ of the circuit is equal to $V_g$, defined immediately above, as the weighted sum of the input voltages. $V_o$ may, therefore, be tuned to one or more selected values, and various values of $V_o$ may be obtained from different combinations of input voltages $V_1, V_2 \ldots V_N$.

Conventional MOSFETs, especially those fabricated pursuant to SOI protocols, suffer from a number of disadvantages. First, the inability to electrically connect to the substrate leads due to the "floating body effect," in which charge becomes trapped between the gate dielectric and the BOX ("buried oxide"), an oxide buried in and bounding a region of a semiconductor layer to define the substrate. The floating body effect produces transient noise in the MOSFET.

Second, MOSFETs may exhibit "parasitic bipolar action" and "parasitic MOS action" due to the presence of forward-biased pnp/npn junctions and parasitic MOSFET channels. Third, the threshold voltage of MOSFETs may exhibit an unpredictable temperature-dependence. Fourth, as already noted, various undesirable leakage currents may occur in a MOSFET when it is in its "off" state. Fifth, fabricating a conventional FET requires that certain procedures be followed, such as using spacers during source and drain formation by diffusion or ion implantation; implementing lightly-doped drain formation steps prior to deep drain formation; and forming gate electrodes that conform to highly accurate critical dimensions. Sixth, the layout of a conventional MOSFET requires that a relatively large layout area be provided to accommodate both a source and a drain, as well as an intervening gate.

SUMMARY OF THE INVENTION

In view of the foregoing, the present invention contemplates a logic switch, which utilizes, rather than avoids, the GIDL effect, which does not depend on MOS action, and which is manufactured according to conventional MOSFET processing protocols, but requires smaller layout area due to the absence of a source. The present invention also contemplates utilization circuits that include the logic switch, including circuits such as inverters (a fundamental IC building block), SRAM cells, neuron-MOSFETs, voltage references, and neuron-MOSFET voltage references.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

GIDL

Figure 1A:
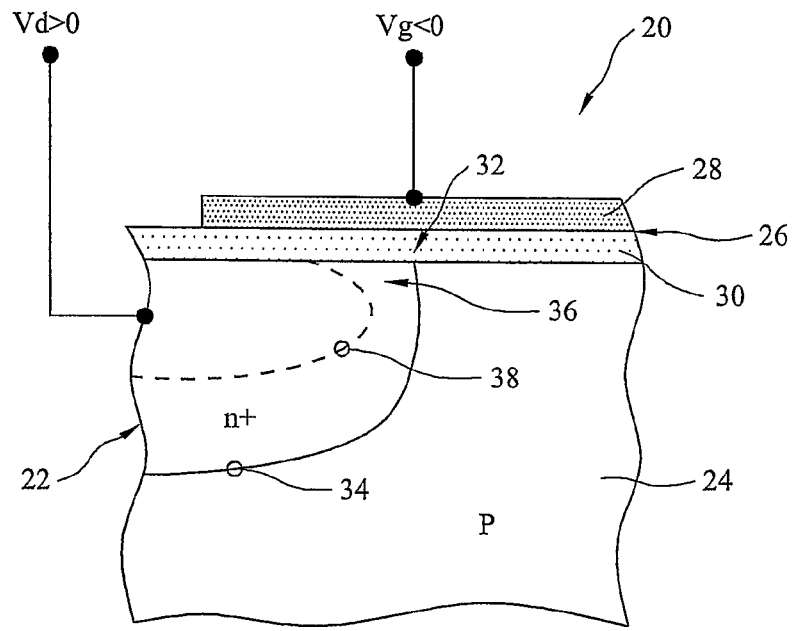
FIGS. 1A and 1B are simplified, sectioned views of a portion of a MOSFET illustrating the GIDL effect therein.

Referring first to FIG. 1, the GIDL effect is briefly discussed. The GIDL effect was first observed in conventional MOSFETs 20 of the type having a source (not shown) and a drain 22, both formed as doped regions in a silicon or other semiconductor substrate 24, and a gate 26. The gate 26 comprises a gate electrode 28 overlying the substrate 24 and a portion of the drain 22. The gate electrode is insulated from the substrate 24 and the drain 22 by a thin gate dielectric or gate oxide 30. In FIG. 1, the drain 22 is an n+ region in a silicon p-substrate 24, and the gate electrode 28 is polysilicon.

Specifically, GIDL was first observed to occur in the drain 22 at and near the conjunction 32 of (a) the boundary 34 between the drain 22 and the substrate 24 and (b) the gate dielectric 30, that is, where the drain 22 and the boundary 34 are overlapped by the gate 26. FIG. 1A illustrates the interior condition of the n-MOSFET 20 when the potential $V_g$ of the gate electrode 28 is slightly negative relative to the potential $V_d$ of the drain 22 ($V_d$>0 and/or $V_g$<0) and the substrate 24 is grounded. The resulting electric field across the gate dielectric 30 (i.e., "vertically" between the surface of the drain 22 and the gate electrode 28) must be supported by charge in the drain 22. This charge is provided by the formation of a depletion region 36 near the surface of the drain 22, having an edge 38 in the drain 22 and contiguous with the depletion region 36 between the n+ drain 22 the p-substrate 24.

Figure 1B:
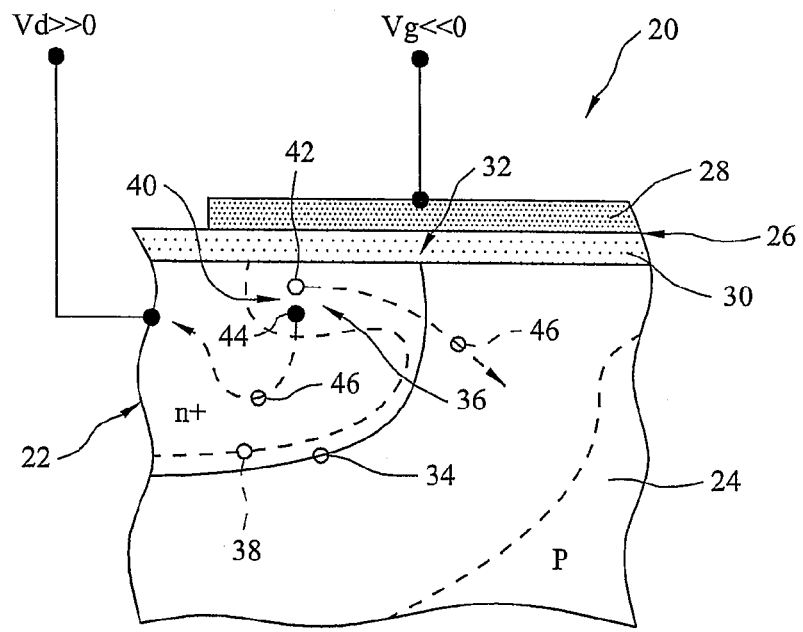

If the electrode 28 is made sufficiently negative relative to the drain 22, as shown in FIG. 1B ($V_d$>>0 and/or $V_g$<<0), an inversion layer will attempt to, but will not, form at the surface of the drain 22 in the depletion region 36. The inversion layer that should, but does not, form is called an "incipient inversion layer." Tunneling-assisted carrier pairs 40 (minority and majority, p and n, or holes and electrons) are produced in the depletion region 36, which assumes the configuration shown in FIG. 1B. As minority (p or hole) carriers 42 arrive at the surface of the drain 22 to attempt to form the inversion layer, they are immediately swept from the drain 22 to the substrate 24, which is at a lower potential for the minority carriers 42. The now unpaired majority carriers (electrons) 44 flow through the drain 22. The current that flows as a result of movement of minority carriers 40 from the drain 22 to the substrate 24 and movement of majority carriers 44 through the drain 22 is the GIDL current 46. The GIDL current 46 is highly independent of temperature.

It is thought that the depletion region near the surface of the drain 22 under the gate 26 results in field crowding and an increase in the local field to enhance high field effects near that region. When the depletion region 36 assumes the configuration shown in FIG. 1B, more intense high field effects result in various trap-assisted carrier-generation events. These events include avalanche multiplication, band-to-band tunneling, thermal emission of electrons from the valence band to a trap site followed by electron tunneling to the conduction band, and/or trap-assisted tunneling from the valence band to the conduction band. If the field is large enough, trap-free, band-to-band tunneling occurs simultaneously with those trap-assisted carrier-generation events.

The GIDL effect also occurs in MOSFETs in which the drain 22 is p+ and the substrate 24 is an n-body. In this event, the roles of the hole 42 and the electron 44 are reversed, the latter moving into the substrate 24 and the former moving through the drain 22. A similar GIDL effect can also occur at the junction of a MOSFET source and its substrate 24. For purposes of simplicity, the discussion herein focuses on the GIDL effect as it occurs in association with the junction between a p+ or n+ drain region respectively in an n-body or a p-body under a gate.

Prior Art Inverter

Inverters are a fundamental element of digital integrated circuits. An inverter is a single-input, single-output digital device which has a "0" logic state output if the input is a "1" logic state, and a "1" output if the input is "0." Multiple inverters can be combined to form logical operators, such as AND, OR, NAND, and NOR operators, as well as other logical function operators.

Figure 2A:
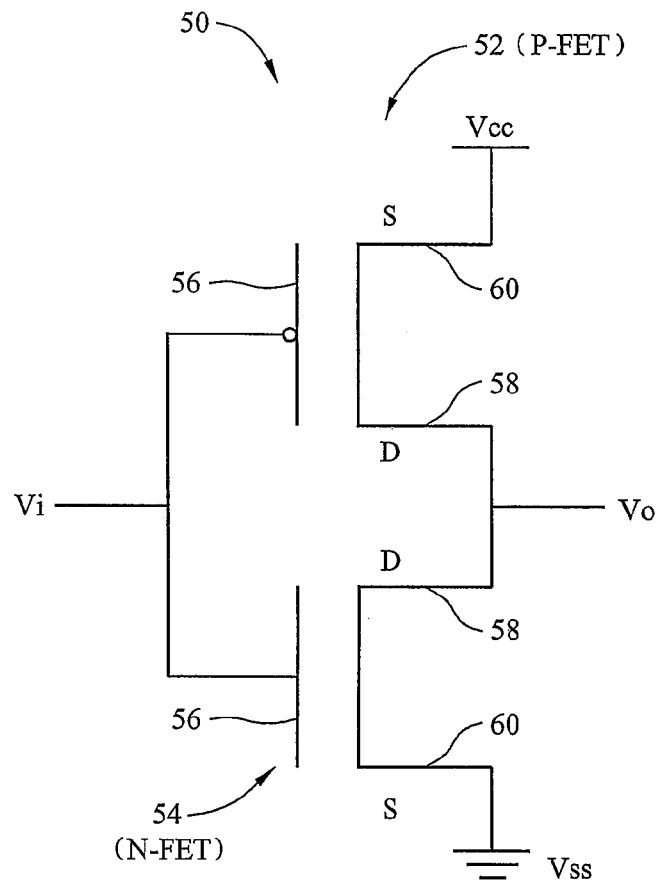
FIG. 2 includes FIG. 2A, which is a schematic of a conventional MOSFET inverter.
FIG. 2B, which is a waveform illustration of the input/output characteristic of the MOSFET inverter of FIG. 2A.
FIG. 2C, which is a sectioned view of the inverter of FIG. 2A implemented and fabricated according to conventional CMOS FET SOI protocols.

FIG. 2 depicts a prior art MOSFET inverter 50 implemented according to SOI protocols. Referring first to the schematic of FIG. 2A, the inverter 50 is implemented according to conventional CMOS protocols and includes a p-MOSFET 52 and an n-MOSFET 54. The gates 56 of the MOSFETs 52 and 54 are connected together and receive an input $V_i$. The drains 58 of the MOSFETs 52 and 54 are connected together to produce an output $V_o$. The source 60 of the transistor 54 is grounded ($V_{ss}$), and the source 60 of the transistor 52 is positively biased at $V_{cc}$.

Figure 2B:
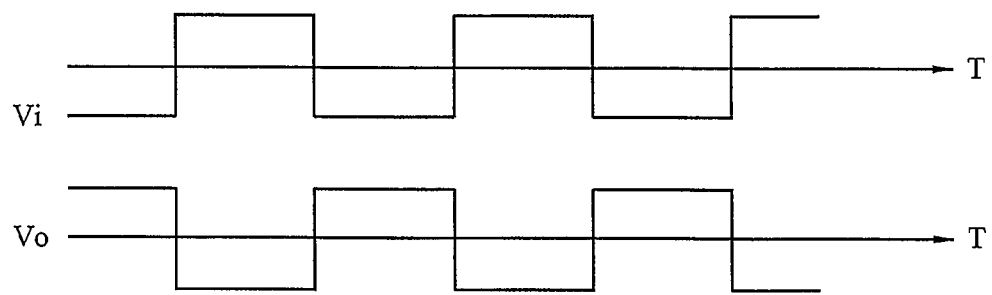

In operation, and referring also to FIG. 2B, when $V_i$ is high (="1"), the n-MOSFET 54 is on and the p-MOSFET is off; the output $V_o$ is pulled down to ground ($V_{ss}$) and is low (="0"). When the input $V_i$ is low (="0"), the p-FET is on and the n-FET is off; the output $V_o$ is $V_{cc}$ or high (="1").

Figure 2C:
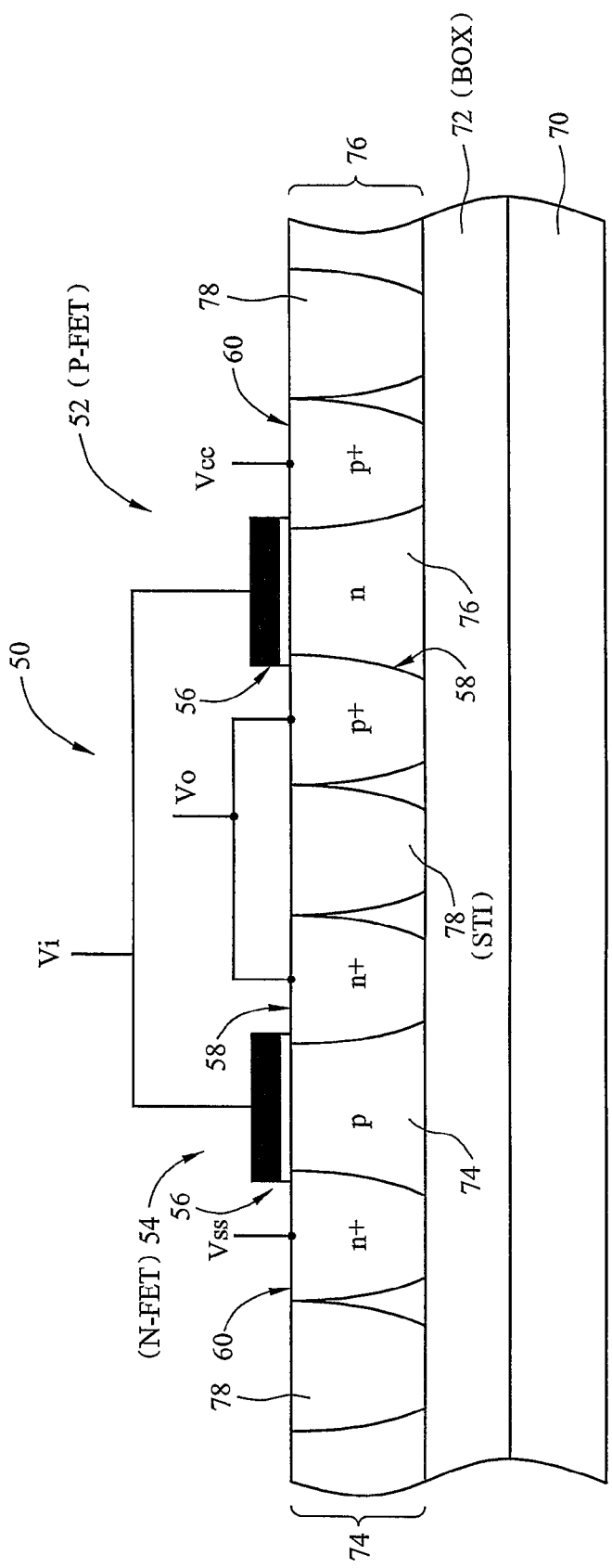

FIG. 2C illustrates the implementation of the CMOS inverter 50 of FIGS. 2A and 2B pursuant to SOI protocols. The inverter 50 includes a silicon substrate or layer 70 on which is a buried oxide layer or BOX 72. The sources 60 and the drains 58 of the MOSFETs 52 and 54 are formed conventionally, as by ion implantation. The source 60 and drain 58 of the n-MOSFET 54 are n+ implantations formed in a p-body 74 of silicon or other suitable semiconductor that is formed on the oxide layer 72. The source 60 and the drain 58 of the p-MOSFET 52 are p+ implantations formed in an n-body 76 of silicon or other suitable semiconductor on the oxide layer 72. The MOSFETs 52 and 54 are separated and isolated from each other and from other devices fabricated on the BOX 72 by STI 78 of silicon oxide or other insulator. While the sources and drains 58 and 60 are shown as extending through the entire depth of the semiconductor bodies 74 and 76 (as in the case where the bodies 74 and 76 are relatively thin silicon layers), the sources and drains 58 and 60 may extend only a portion of the way through the depth of the bodies 74 and 76 (as in the case of thicker SOI layers). This applies to the other figures and other illustrated embodiments, as well.

Prior Art GIDL Inverter: '075 Patent

The '075 patent discloses an inverter 80, the operation of which is based on the GIDL effect. As discussed above, GIDL is considered to be deleterious to the conventional operation of conventional MOSFETs and is something to be suppressed or avoided. In the '075 patent, GIDL is intentionally utilized in an inverter fabricated as a MOSFET-like device on a bulk wafer. The operation of the inverter 80 is not based on so-called MOS action or FET action involving surface inversion and channel current. Rather its operation is based on the GIDL effect.

Figure 3:
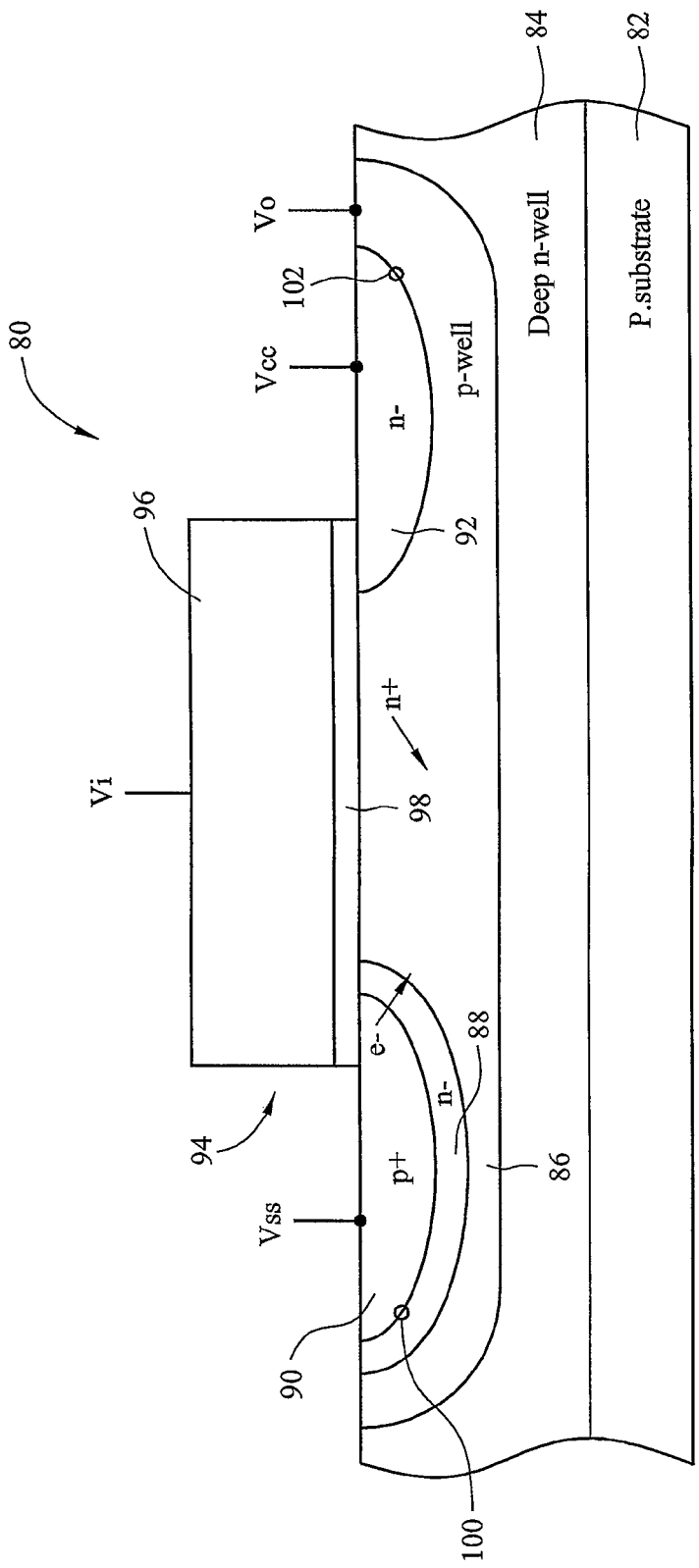
FIG. 3 is a sectioned view of one embodiment of an inverter according to the '075 patent, the inverter being more or less configured as one using conventional MOSFETs, but relying for its operation on a gated diode functioning by the GIDL effect.

As shown in FIG. 3, the inverter 80 includes a p-substrate 82 with a deep n-well 84 formed therein. A p-well 86 is formed in the n-well 84. An n-base 88 is formed in a portion of the p-well 86, and a p+ structure 90 is formed within the n-base 88. An n+ structure 92 is formed in another portion of the p-well 86 separated from the p+structure 90 and the n-base 88.

A gate 94 comprising a gate electrode layer 96 on a gate dielectric layer 98 is formed to overlie the free surface of the p-well 86. One side of the gate 94 overlies the n-base and the boundary 100 between the n-base and the p+ structure. The opposite side of the gate 94 overlies the boundary 102 between the p-well 86 and the n+ structure 92.

The processes and steps used to fabricate the inverter 80 are conventionally used to fabricate CMOS devices and are more specifically described in the '075 patent.

The gate electrode 96 receives an input $V_i$; an output $V_o$ is obtained from a connection to the p-well 86. The p+ structure 90 is connected to ground ($V_{ss}$), and the n+ structure 92 is connected to a positive voltage $V_{cc}$.

In operation, when $V_i$ is high or "1" (approximately $V_{cc}$), electrons e⁻ move from the p+ structure 90 into the n-base 88 due to the GIDL effect, as explained earlier. These electrons pull down the n-base 88 and the p-well 86 to near ground or "0" which is output at $V_o$. When the input $V_i$ is low (approximately ground) or "0," holes p⁺ move from the n+ structure 92 into the p-well 86, pulling the p-well up to $V_{cc}$ or "1," which is output at $V_o$. The waveforms of $V_i$ and $V_o$ are similar to FIG. 2B.

By inverting the polarities of the conduction types and biases, there may be realized an inverter having $V_o$ taken from the n-well that replaces the p-well 86.

Structure of Gated GIDL Diode

Figure 4A:
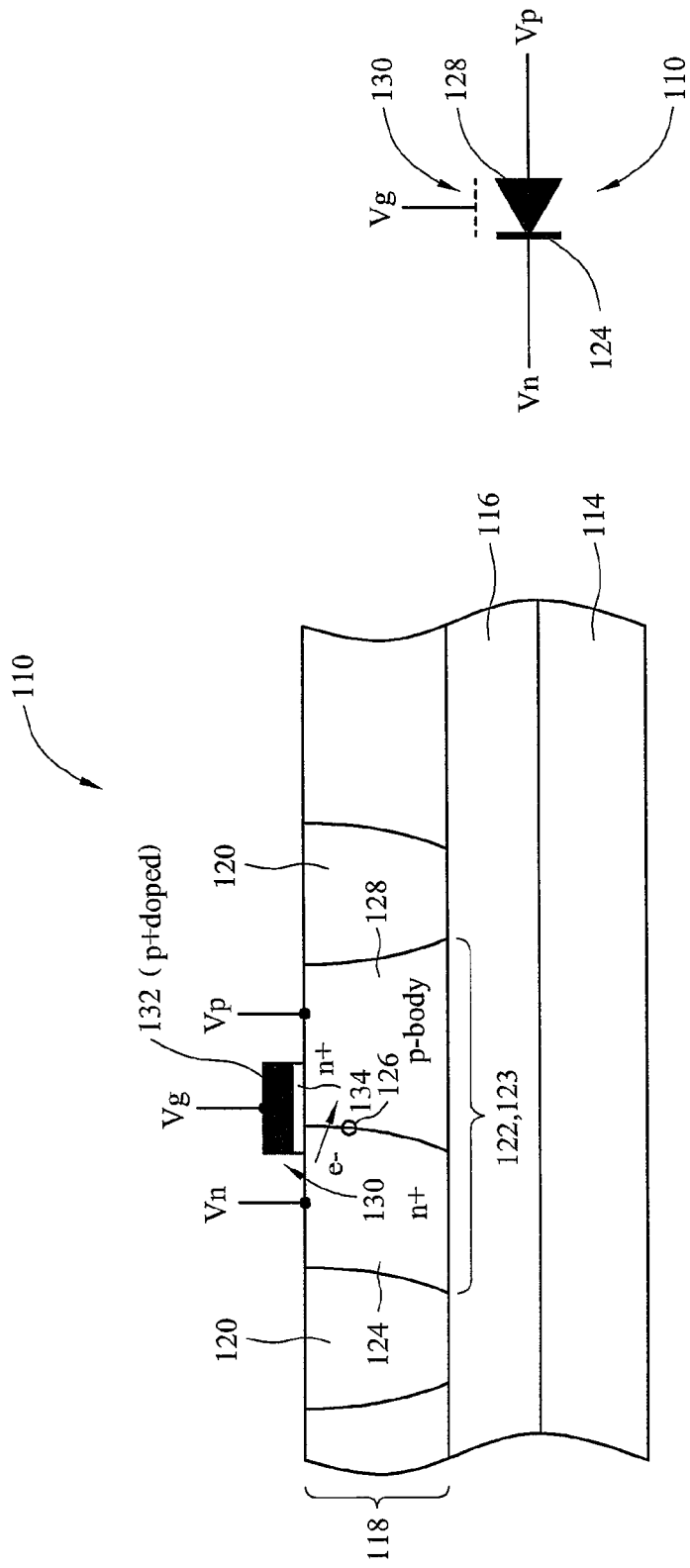
FIG. 4 includes FIG. 4A, which is a sectioned view of a logic switch comprising an n+/p-body SOI gated diode that functions according to the GIDL effect and the electrical schematic notation therefore.
FIG. 4B, which is a sectioned view of a logic switch comprising a p+/n-body SOI gated diode that functions according to the GIDL effect and the electrical schematic notation therefore.
Figure 4B:
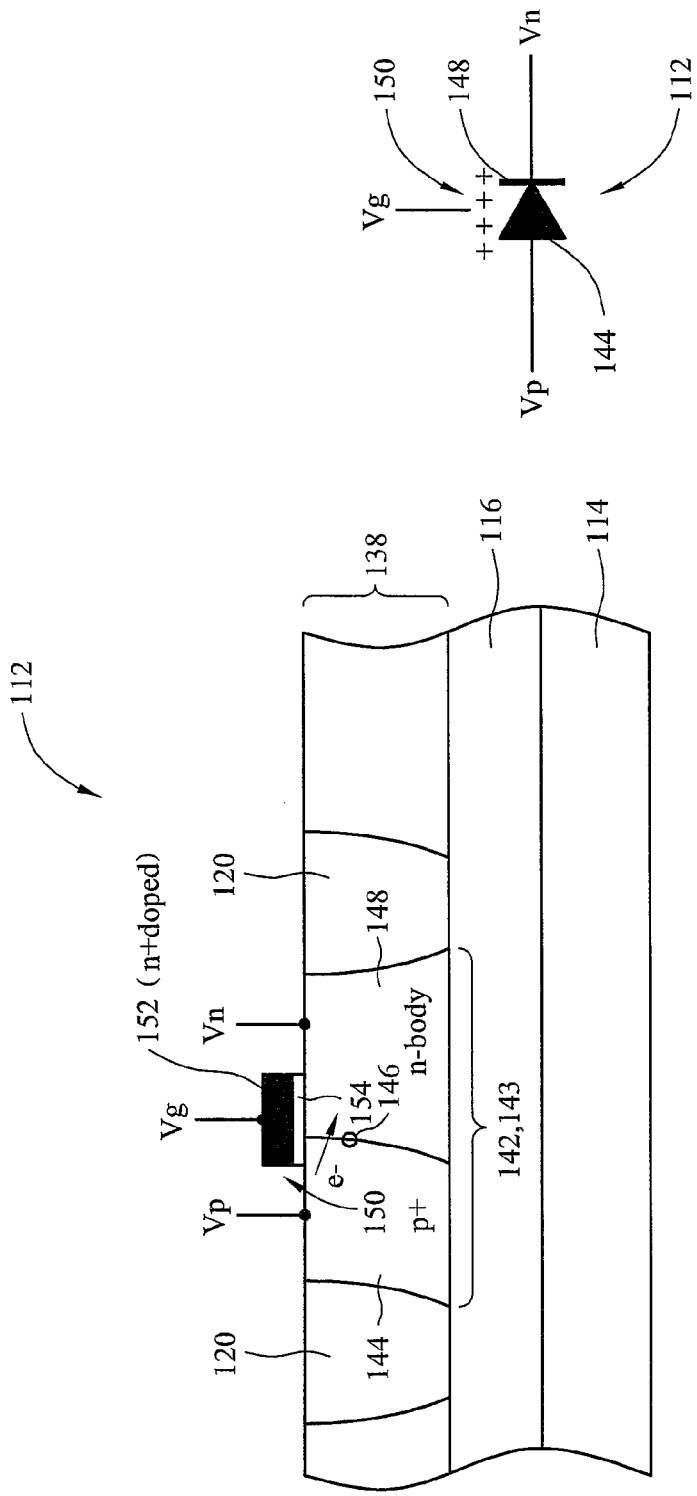

Referring now to FIGS. 4A and 4B, a first aspect of the present invention relates to two complimentary logic switches 110 and 112. Both logic switches 110 and 112 are implemented as gated diodes, the operating principle of which is the GIDL effect and the current produced thereby. In preferred embodiments, the gated GIDL diodes 110 and 112 are fabricated according to SOI protocols: each gated GIDL diode 110,112 is completely isolated by STI oxide and BOX. Bulk protocol versions may also be realized by using wells for isolation of each gated GIDL diode.

In FIGS. 4A and 4B, the gated GIDL diodes 110 and 112 include a silicon or other suitable semiconductor substrate 114 covered with a buried oxide, or BOX, layer 116, according to SOI protocols.

In FIG. 4A, the BOX layer 116 is covered with a layer of p-silicon 118. Silicon oxide STI 120 defines a diode site 122 by isolating or enclosing a volume 123 of the silicon layer 118. The STI 120 extends from the free surface of the silicon layer 118 to the BOX layer 116. Accordingly, the STI 120 electrically isolates the diode site 122 and the enclosed silicon volume 123 from the rest of the silicon layer 118.

An n+ region 124 is formed within the diode site 122 in a portion of the volume 123 of the silicon layer 118 enclosed by the STI 120. N+ region formation is preferably achieved by conventional ion implantation. The foregoing produces a boundary or junction 126 between the unimplanted portion or p-body 128 of the enclosed silicon volume 123 (the portion of the volume not containing the n+ region 124) and the n+ region 124.

Overlying the boundary 126 between the p-body 128 and the n+ region 124 is a gate 130. The gate 130 comprises a gate electrode layer 132 insulated by a gate dielectric layer 134 from the boundary 126, and from the n+ region/p-body 124/128. The gate electrode 132 comprises heavily p-doped polysilicon.

In FIG. 4A, for convenience, $V_n$ represents the potential of the n+ region 124 of the diode 110. $V_p$ represents the potential of the p-body 128 of the diode 110. $V_g$ represents the potential of the gate electrode 132, which, depending on the magnitude of a negative voltage (relative to $V_p$ and $V_n$) applied thereto (as explained below): (a) permits the diode 110 to conduct current bi-directionally between the p-body 128 and the n+ region 124 $V_p$, or, (b) causes the diode 110 to conduct current uni-directionally from the p-body 128 to the n+ region 124 (as in a typical p-n junction diode) or, (c) bi-directionally blocks current flow between the p-body 128 and n+ region 124. Operating mode (c) can occur only if the p-body 128 is sufficiently thin and/or lightly doped for $V_g$ to effect full depletion therein.

In FIG. 4B, the BOX layer 116 is covered with a layer of n-silicon 138. The silicon oxide STI 120 defines a diode site 142 by enclosing a volume 143 of the n-silicon layer 138. The STI 120 extends from the free surface of the n-silicon layer 138 to the BOX layer 116. Accordingly, the STI 120 electrically isolates the diode site 142 and the enclosed silicon volume 143 from the rest of the silicon layer 138.

A p+ region 144 is formed within the diode site 142 in a portion of the volume 143 of the silicon layer 138 enclosed by the STI 120. P+ region formation is preferably achieved by conventional ion implantation. The foregoing produces a boundary 146 between the unimplanted portion or n-body 148 of the enclosed silicon volume 143 (the portion of the volume not containing the p-region 124) and the p+ region 144.

Overlying the boundary 146 between the n-body 148 and the p+ region 144 is a gate 150. The gate 150 comprises a gate electrode layer 152 insulated by a gate dielectric layer 154 from the boundary 146, and from the p+ region/n-body 144/148. The gate electrode 152 comprises heavily n-doped polysilicon.

In FIG. 4B, $V_n$ represents the potential of the n-body 148, and $V_p$ represents the potential of the p+ region 144. $V_g$ represents the potential of the gate electrode 152, which, as explained below and depending on the magnitude of a positive voltage (relative to $V_p$ and $V_n$) applied thereto, (a) permits the diode 112 to conduct bi-directionally between the p+ region 144 and the n-body 148, (b) permits the diode 112 to conduct current uni-directionally from the p+ region 144 to the n-body 148 (as in a typical p-n junction diode), or (c) bi-directionally blocks current flow between the p+ region 144 and n-body 148. Regarding operating mode (c), a caveat similar to that noted above as applicable to the thickness and/or light doping of the p-body 128 also applies to the thickness and/or doping of the n-body 148.

It is preferred that CMOS-compatible protocols be followed in fabricating the diodes 110 and 112 of the present invention. In this fashion, both GIDL-related devices 110 and 112, as well as conventional CMOS devices located elsewhere in the IC, may be fabricated on the same chip. While conventional CMOS protocols are preferably practiced to fabricate both gated diodes 110 and 112, certain procedures contrary to conventional MOSFET fabrication are followed in order to enhance the GIDL effect. The reason for this, of course, is that the diodes 110 and 112 are intentionally designed and operated to take advantage of and to utilize the GIDL effect, rather than to suppress it.

To the foregoing end, certain contra-MOSFET procedures are preferably followed. For purposes of the following discussion, it is noted that the implanted regions 124 and 144 of the diodes 110 and 112 are viewed as "drains" of a MOSFET, even though the diodes 110,112 are "sourceless."

A first contra-MOSFET procedure comprises forming the gate dielectrics 134 and 154 to be as thin as possible. Thinner gate dielectrics in MOSFETs or MOSFET-like structures encourage GIDL, while thicker gate dielectrics discourage GIDL. Second, doping the polysilicon gate electrodes 132 and 152 to the same polarity as the p-body and n-body 128 and 148 is contrary to conventional MOSFET fabrication. The purpose of this doping is to encourage GIDL by the "built-in" field in the gate dielectrics 134,154 as explained in greater detail below. Third, the implanted regions 124 and 144 ("drains") are doped sufficiently high to ensure that significant band-to-band tunneling occurs due to a relatively short tunneling length; graded, or lightly doped drain ("LDD"), structures are not utilized. Extremely light drain doping will suppress GIDL. Avoidance of LDD, and the concomitant elimination of LDD-related spacers, both simplify CMOS-compatible fabrication.

In FIG. 4A, the heavy p-doping of the gate electrode 132 of the gated diode 110 effects or induces an "automatic" or "built-in" negative electric field in the gate oxide 134. This negative electric field, which is present even when $V_n=V_p=V_g$, acts at and in the vicinity of the boundary 126 to partially deplete or nearly invert the surface of the n+ region 124 (see FIG. 16-A1) and to effect slight accumulation at the surface of the p-body 128 (see FIG. 16-B1). In FIG. 4B, the heavy n-doping of the gate electrode 152 of the gated diode 112 affects the built-in or automatic positive electric field in the gate oxide 154. This positive electric field, which is, again, present when $V_n=V_p=V_g$, acts at and in the vicinity of the boundary 146 to partially deplete or nearly invert the surface of the p+ region 144 and to effect slight accumulation at the surface of the n-body 148. As one of ordinary skill in the art will realize, these conditions are conducive to the flow of GIDL current between the semiconductor regions at thermal equilibrium (thermal equilibrium being illustrated as the dotted line in FIGS. 16-A1 and 16-B1) with no potential difference between the gate electrode and the semiconductor regions. As the current flow occurs due to the presence of the gate electrode 152, it is commonly referred as GIDL current.

Electric schematic symbols for the gated diodes 110 and 112 are presented at the right of FIGS. 4A and 4B. The indicia "---" and "+++" indicate the polarity of the voltage of the gate electrodes 132,152 relative to $V_p$ and $V_n$ that is applied to the respective gates 130 and 150 of the diodes 110 and 112 to effect one of the three operating modes thereof.

Operation of Gated GIDL Diode

Figure 16:
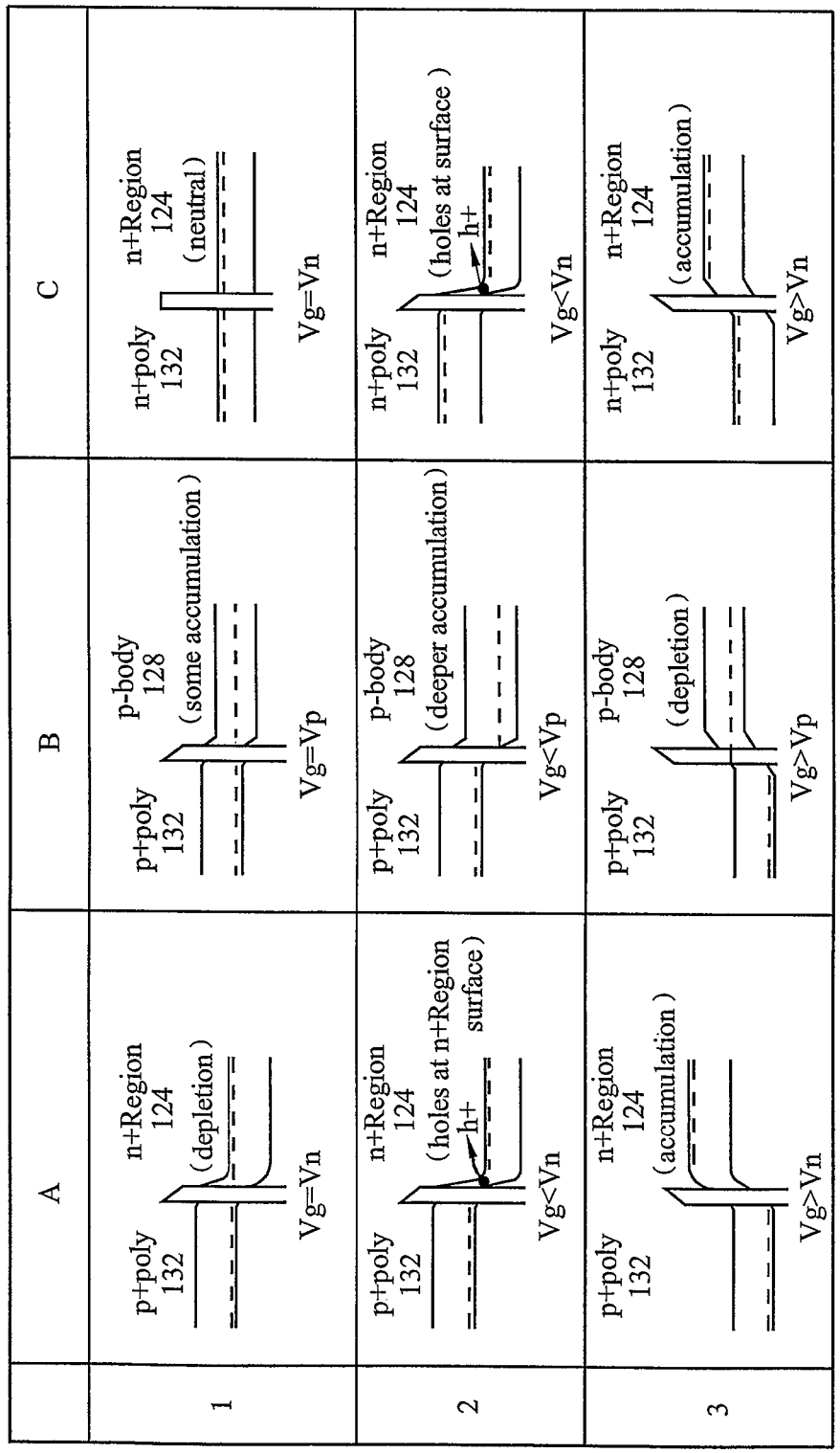
FIG. 16 is a series of energy band diagrams identified as A1 through C3 representing the energy states of various embodiments of the gated-diode of the present invention at times described below.

As noted above, with $V_p=V_n=V_g$ in the logic switch or diode 110 of FIG. 4A, the heavily p-doped polysilicon gate electrode 132 creates a negative field in the gate oxide 134, so that the surface of the n+ region 124 is in depletion or nearly in inversion (FIG. 16-A1) and the surface of the p-body 128 is in slight accumulation (FIG. 16-B1). Accordingly, the dopant concentration of the gate electrode is conducive to the flow of GIDL current between the n+ region 124 and the p-body 128 at thermal equilibrium with no potential difference between the gate electrode and the n+ region 124 and the p-body 128.

To turn the diode 110 "fully on," so that it can conduct bi-directionally—this is operating mode "(a)" of the diode 110—$V_g$ is made more negative than $V_p$ (FIG. 16-B2) and $V_n$ (FIG. 16-A2), i.e., $V_g<V_p$ and $V_g<V_n$. In this condition, the surface of the n+ region 124 under the gate 130 becomes deeply depleted or inverted (FIG. 16-A2), so that the GIDL effect, as described above, causes holes (h+ in FIGS. 4A and 16A2) to be generated by band-to-band tunneling and the other previously discussed phenomena. The holes, h+, tend to flow into the p-body 128 to produce a GIDL current. Simultaneously, the surface of the p-body 128 under the gate 130 is driven into deeper accumulation (FIG. 16-B2), which reduces the resistance of the p-body. The more negative $V_g$ is relative to $V_p$ or $V_n$, the greater is the level of accumulation and the magnitude of the GIDL current.

In the foregoing circumstances, i.e., in operating mode (a), the diode 110 can conduct current bi-directionally, depending on the relative voltages applied to $V_p$ and $V_n$. With $V_n$ positive relative to $V_p$, current will flow from the n+ region 124 to the p-body 128, that is, from $V_n$ to $V_p$. Such current flow can occur because of the occurrence of the GIDL effect and the low resistance of the p-body 128. If $V_p$ is made positive relative to $V_n$, current will flow from the p-body 128 to the n+ region 124, that is, from $V_p$ to $V_n$. This latter current flow occurs because of the low resistance of the p-body 128 and the forward biasing of the pn junction, namely the boundary 126 between the p-body 128 and the n+ region 124. In this instance there is no GIDL current; typical pn junction current is the main current of conduction.

To turn the diode 110 "partially off," operating mode (b), so that current cannot flow from the n+ region 124 to the p-body 128 ($V_n$ to $V_p$), but current can flow from the p-body 128 to the n+ region 124 ($V_p$ to $V_n$), $V_g$ is made more positive than $V_n$ (FIG. 16-A3) and $V_p$ (FIG. 16-B3), but not so positive as to fully deplete the p-body 128. In this condition, the surface of the n+ region is in accumulation; the GIDL current is absent. The surface of the p-body 128 is in depletion and the resistance of the p-body 128 is increased. The diode 110 will not conduct current from the n+ region 124 to the p-body 128 because the pn junction 126 is reverse biased and there is no GIDL current. However, if the junction 126 is sufficiently forward biased by $V_p$ being positive relative to $V_n$, current can flow from the p-body and $V_p$ to the n+ region and $V_n$ as in a typical forward-biased pn junction.

If the p-body 128 is sufficiently thin and/or sufficiently lightly doped, operating mode "(c)" of the diode 110 is achieved by $V_g$ being sufficiently positive relative to $V_p$ and $V_n$ to fully deplete the p-body 128 so that no current flow from $V_p$ to $V_n$ can occur, even though the pn-junction is forward biased.

As to the diode 112 of FIG. 4B, with $V_p=V_n=V_g$, the heavily n-doped polysilicon gate electrode 152 creates a positive field in the gate oxide 154, so that the surface of the p+ region 144 is in depletion or nearly in inversion and the surface of the n-body 148 is in slight accumulation. Accordingly, the dopant concentration of the gate electrode is conducive to the flow of GIDL current between the p+ region 144 and the n-body 148 at thermal equilibrium with no potential difference between the gate electrode and the n+ region 124 and the p-body 128.

To turn the diode 112 "fully on," so that it can conduct bi-directionally—this is operating mode "(a)" of the diode 112—$V_g$ is made more positive than $V_p$ and $V_n$, i.e., $V_g>V_p$ and $V_g>V_n$. In this condition, the surface of the p+ region 144 under the gate 150 becomes deeply depleted or inverted, so that the GIDL effect, as described above, causes electrons (n– in FIG. 4B) to be generated by band-to-band tunneling and other phenomena. The electrons tend to flow into the n-body 148 to produce a GIDL current. Simultaneously, the surface of the n-body 148 under the gate 150 is driven into deeper accumulation, which reduces the resistance of the n-body. The more positive $V_g$ is relative to $V_p$ and $V_n$, the greater is the level of accumulation and the magnitude of the GIDL current.

In the foregoing circumstances, operating mode (a), the diode 112 can conduct current bi-directionally, depending on the relative voltages applied to $V_p$ and $V_n$. With $V_n$ positive relative to $V_p$, current will flow from the n-body 148 to the p+ region 144, that is, from $V_n$ to $V_p$. Such current flow can occur because of the occurrence of the GIDL effect and the low resistance of the n-body 128. If $V_p$ is made positive relative to $V_n$, current will flow from the p+ region 144 to the n-body 148, that is, from $V_p$ to $V_n$. This latter current flow occurs because of the low resistance of the n-body 128 and the forward biasing of the pn junction, namely the boundary 146 between the p+ region 144 and the n-body 148.

To turn the diode 110 "partially off" so that current cannot flow from the n-body 148 to the p+ region 144 ($V_n$ to $V_p$), but current can flow from the p+ region 144 to the n-body 148 ($V_p$ to $V_n$), $V_g$ is made more negative than $V_n$ and $V_p$, but not so negative as to fully deplete the n-body 148. This is operating mode (b) of the diode 112. In this condition, the surface of the p+ region 144 is in accumulation; the GIDL current is absent. The surface of the n-body 148 is in depletion and the resistance of the n-body 148 is increased. The diode 112 will not conduct current from the p+ region 144 to the n-body 148, because the pn junction 146 is reverse biased and there is no GIDL current. However, if the junction 146 is sufficiently forward biased by $V_p$ being positive relative to $V_n$, current can flow from the p+ region 144 and $V_p$ to the n-body 148 and $V_n$ by the forward biasing of the pn junction.

If the n-body 148 is sufficiently thin and/or sufficiently lightly doped, operating mode "(c)" of the diode 112 is achieved by Vg being sufficiently negative relative to $V_n$ and $V_p$ to fully deplete the n-body 148 so that no current flow from $V_p$ to $V_n$ can occur.

GIDL Inverter

FIG. 5 depicts an inverter 160 fabricated by CMOS-compatible protocols. The inverter comprises one gated diode 110 of the type shown in FIG. 4A and one gated diode 112 of the type shown in FIG. 4B. The diodes 110 and 112 are fabricated on a common substrate 162 covered with a BOX layer 164, but are otherwise the same as their implementations as shown in FIG. 4 (although the gated diode 112 is depicted rotated 180° into and out of the plane of FIG. 4B). The diodes 110 and 112 are separated and isolated from each other and from other devices by STI 120 and the BOX layer 164. $V_{ss}$ is low or is at 0 volts and is applied to the p+ region 144 of the diode 112. $V_{cc}$ is a positive voltage applied to the n+ region of the diode 110. The input, $V_i$, is connected to both gate electrodes 132 and 152. The output, $V_o$, is taken from the p-body 128 and the n-body 148 connected together.

When $V_i$ is low (=$V_{ss}$), holes, h+, are generated at the surface of the n+ region 124 under the gate 130 by the GIDL effect, and this "hole GIDL" current flows into the p-body 128. This results in the connection to the p-body 128, and consequently the output $V_o$, being driven high to $V_{cc}$. When $V_i$ is low, no GIDL-effected electron flow from the p+ region 144 to the n-body 148 occurs.

When $V_i$ is high (=$V_{cc}$), electrons, e−, are generated on the surface of the p+ region 144 under the gate 152 due to the GIDL effect, and this "electron GIDL" current flows into the n-body 148. This results in the connection to the n-body 148 and the output $V_o$ being driven low to $V_{ss}$. When $V_i$ is high, no GIDL-effected hole flow from the n+ region 124 to the p-body 128 takes place.

Figure 5A:
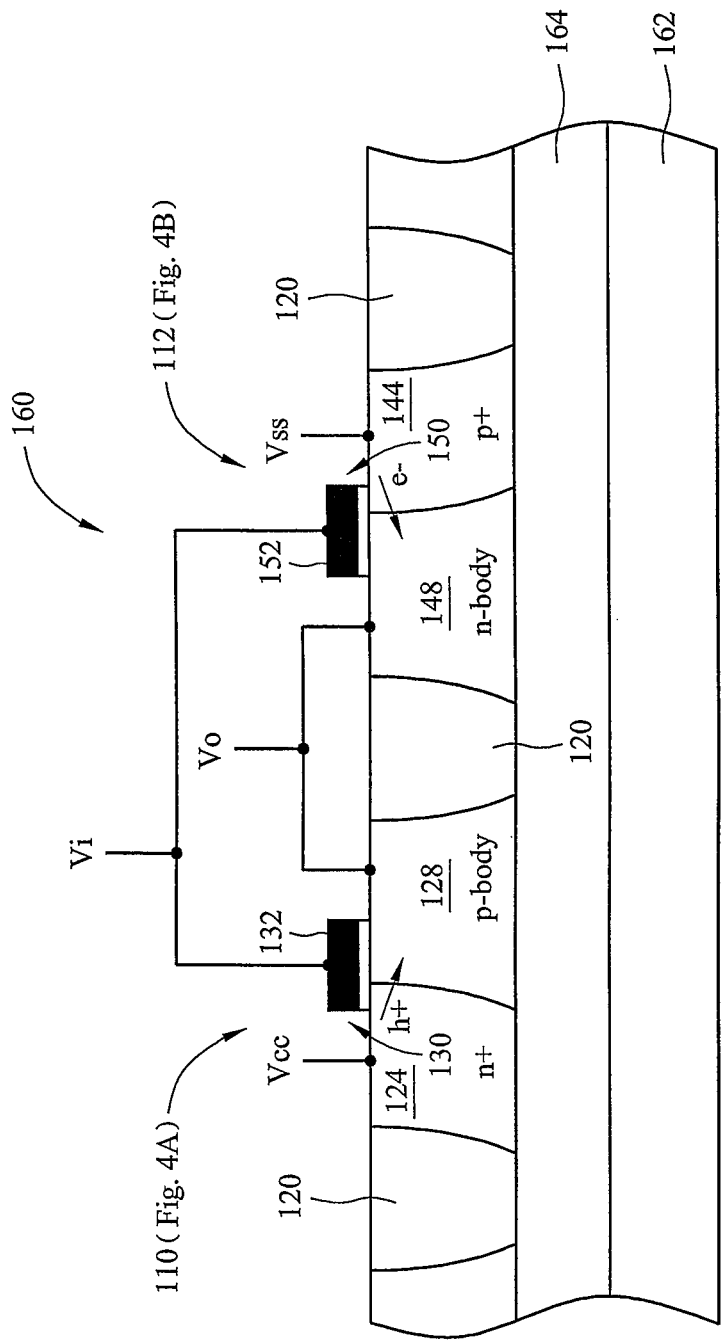
FIG. 5 includes FIG. 5A, which is a sectioned view illustrating an inverter comprising the GIDL gated diodes shown in FIGS. 4A and 4B.
FIG. 5B, which is a schematic representation of the inverter of FIG. 5A, indicating the circuit notation therefore.
FIG. 5C, which generally depicts a layout for the inverter of FIGS. 5A and 5B.

Thus, in the inverter 160 of FIG. 5A, when $V_i$ is low, $V_o$ is high, and vice versa. The speed of the inverter 160 is determined by the magnitude of the GIDL current (hole or electron), which, in turn, is dependent on the magnitude of $V_i$ and, of course, on other process parameters, such as doping of the n+ and p+ "drains" 124 and 144 and the thickness of gate oxides 134 and 154.

Figure 5B:
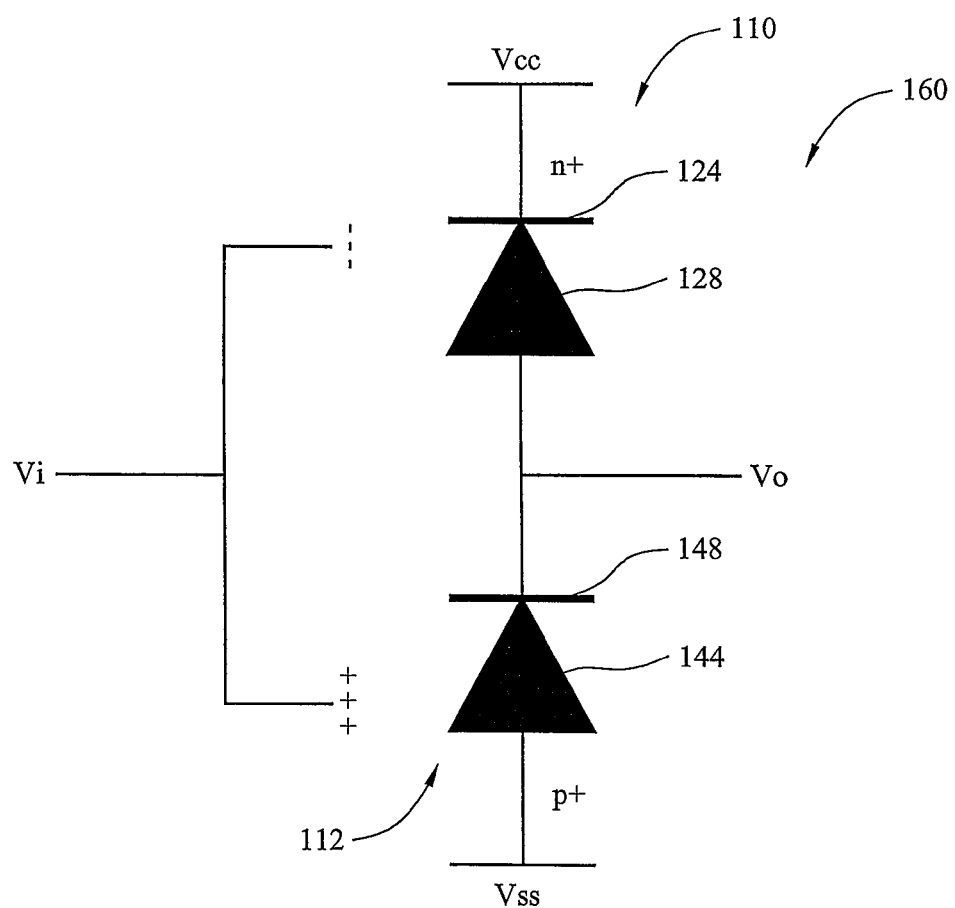

FIG. 5B is a schematic, notational representation of the GIDL inverter 160, using some of the reference numerals as in FIG. 5A and combining the schematic representations shown at the right of FIGS. 4A and 4B.

Figure 5C:
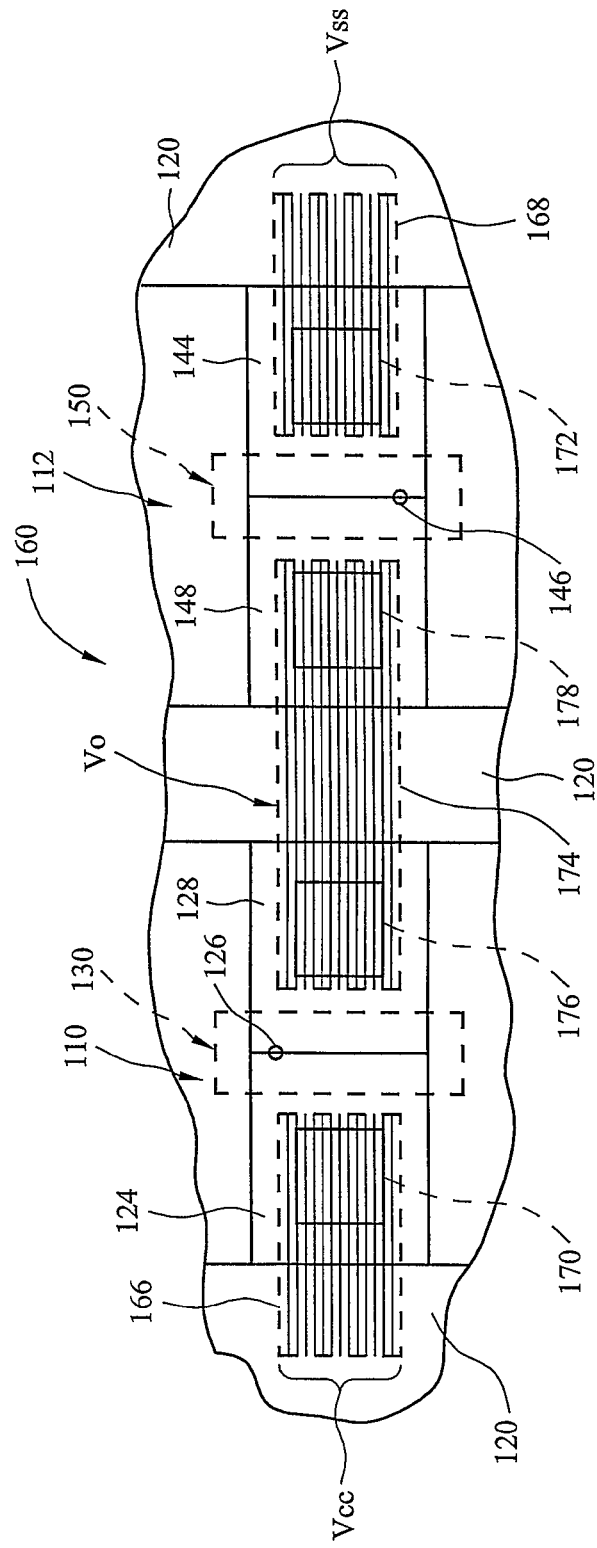

FIG. 5C is a top view of a layout of the inverter 160 fabricated by CMOS-compatible techniques. Again, some of the reference numerals of FIG. 5A have been used to denote certain elements of the inverter 160. $V_{cc}$ and $V_{ss}$ are connected to metal layers 166 and 168 deposited to be electrically continuous with underlying metal contacts 170 and 172 deposited on and electrically continuous with the n+ region 124 and the p+ region 144, respectively. $V_o$ is taken from a metal layer 174 deposited to be electrically continuous with underlying metal contacts 176 and 178 deposited on and electrically continuous with the p-body 128 and the n-body 148, respectively. The $V_i$ connection to the gates 130 and 150 is not shown.

Figure 6:
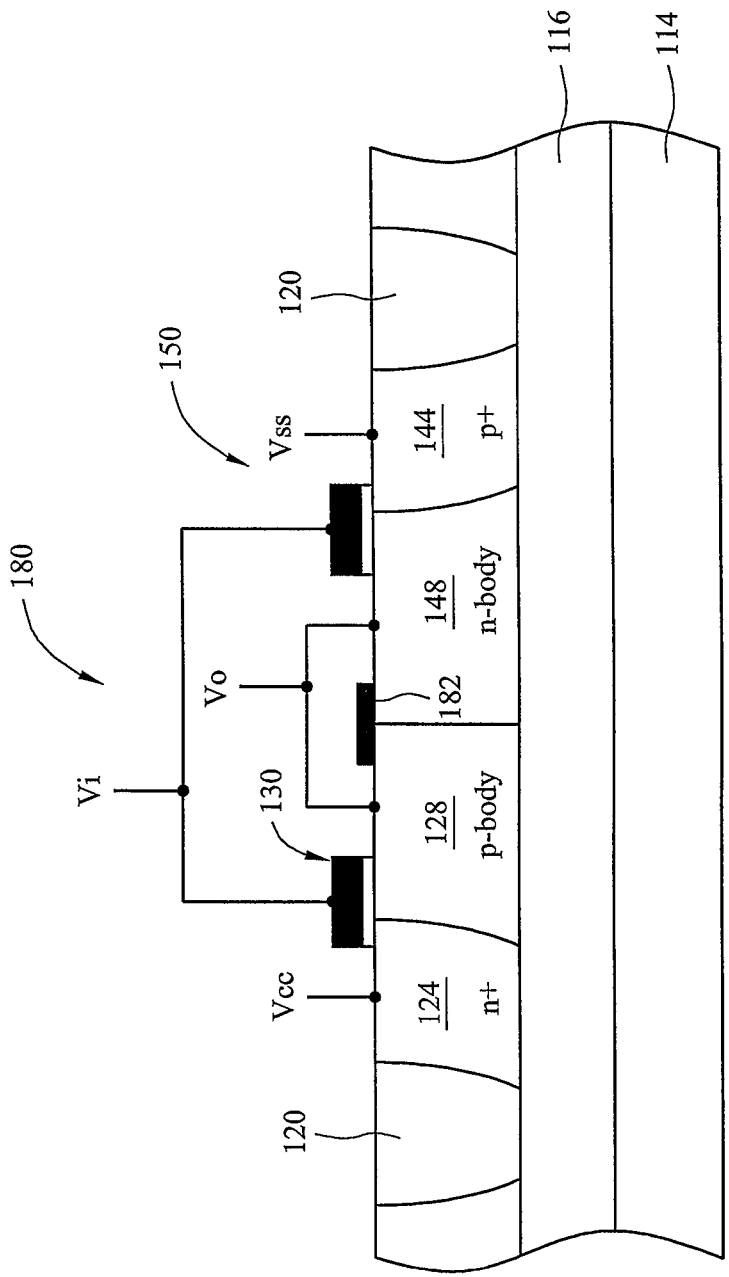
FIG. 6 is a sectioned view of an alternative version of the inverter in FIG. 5.

FIG. 6 depicts an inverter 180 similar to, but simplified with respect to, the inverter 160. In the inverter 180 the STI 120 between the diodes 110 and 112 has been eliminated and a butting contact 182 shorts together the p-body 128 and the n-body 148. The inverter 180 has a smaller layout than the inverter 160. The butting contact 182 prevents any bipolar action of the parasitic pnp and npn structures 128-148-144 and 124-128-148, respectively. No MOS action occurs because the gates 130 and 150 overlie only the respective boundaries or junctions 126 and 146, so that there is no channel formed between the n+ region 124 and the n-body 148 through the p-body 126 or between the p+ region 144 and the p-body 126 through the n-body 148.

Figure 7A:
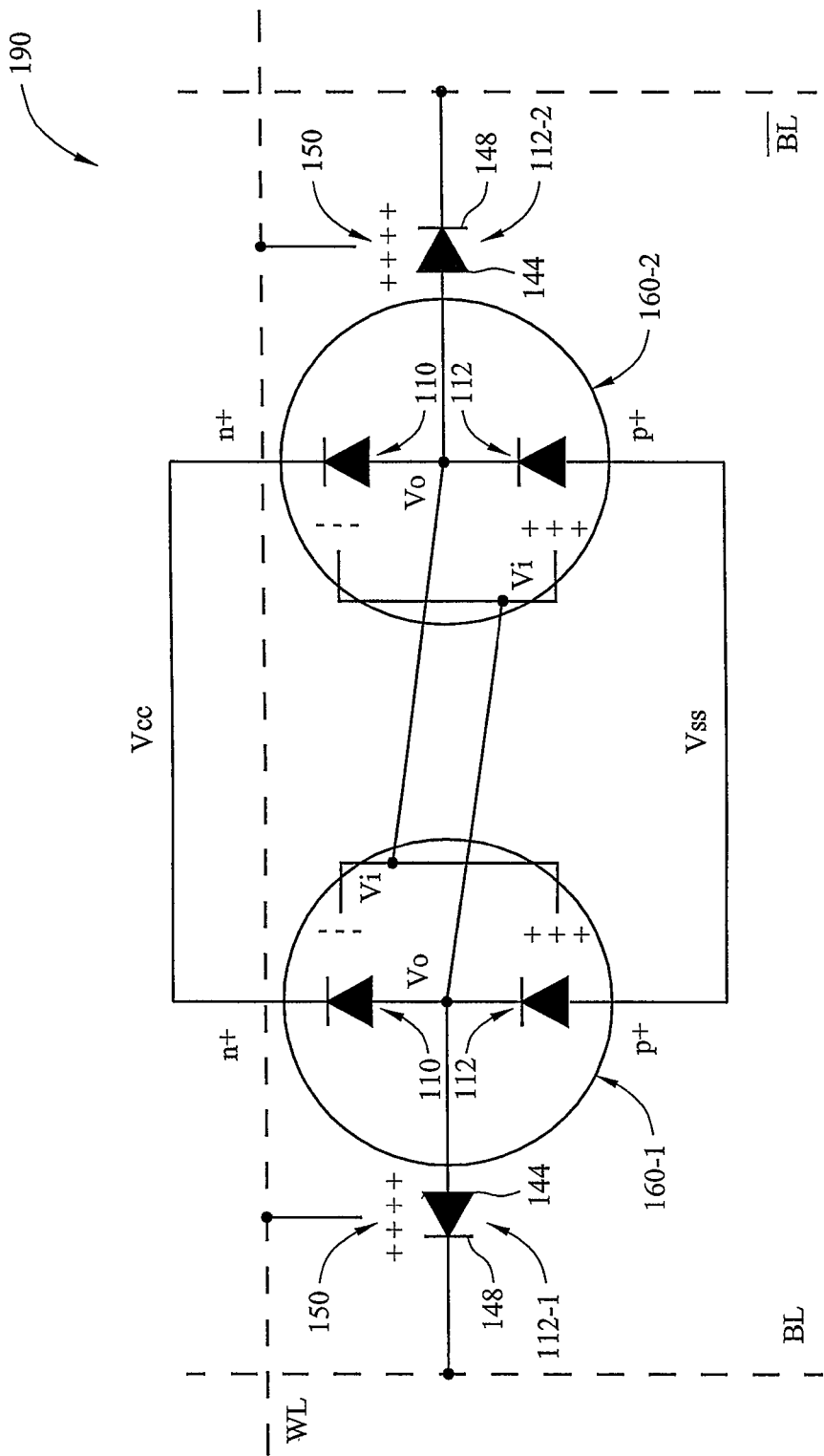
FIG. 7 includes FIG. 7A, which is a schematic representation of a 6-GIDL gated diode SRAM cell, four of the gated diodes of which are those shown in FIGS. 4A and 4B and the pass-gates of which are the gated diodes of FIG. 4B.
FIG. 7B, which is a schematic representation of a 6-GIDL gated diode SRAM cell, four of the gated diodes of which are those shown in FIGS. 4A and 4B and the pass-gates of which are the gated diodes of FIG. 4A.
Figure 7B:
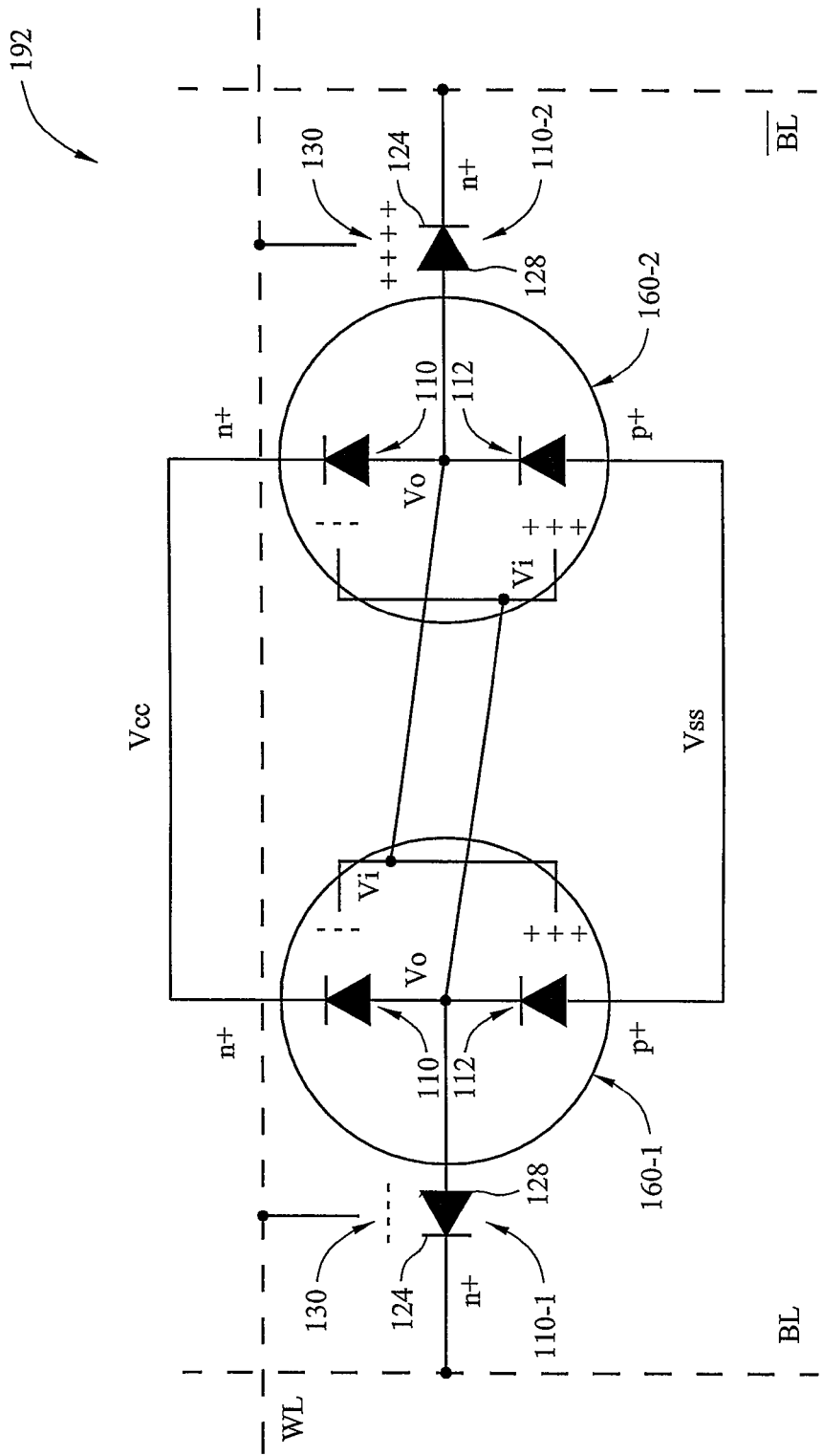

FIGS. 7A and 7B depict two GIDL SRAM cell embodiments 190 and 192 comprised of the GIDL inverter 160 of FIG. 5 and either the gated GIDL diode 110 of FIG. 4A (FIG. 7A) or the gated GIDL diode 112 of FIG. 4B (FIG. 7B).

In FIG. 7A, the inverter 160-1 has its output $V_o$ connected to the input $V_i$ of the inverter 160-2 and to the cathode 144 of a gated diode 112-1 functioning as a pass-gate. The output $V_o$ of the inverter 160-2 is connected to the input $V_i$ of the inverter 160-1 and to the cathode 144 of a gated diode 112-2 functioning as a pass-gate. The cathode 148 of the pass-gate 112-1 is connected to BL and its gate 150 is connected to WL. The gate 150 of the pass-gate 112-2 is connected to WL and its cathode 148 is connected to BL. The connections in FIG. 7B are the same, the pass gate GIDL diodes 112-1 and 112-2 of FIG. 7A being replaced with diodes 110-1 and 110-2. In both SRAM cells 190 and 192 the silicon bodies 128 and 148 are sufficiently thin and/or sufficiently lightly doped body to permit the pass gates 112-1, 112-2, 110-1 and 110-2 to be operated in the fully depleted, bi-directional blocking mode "(c)," described above.

Prior Art Voltage Sources

Figure 8:
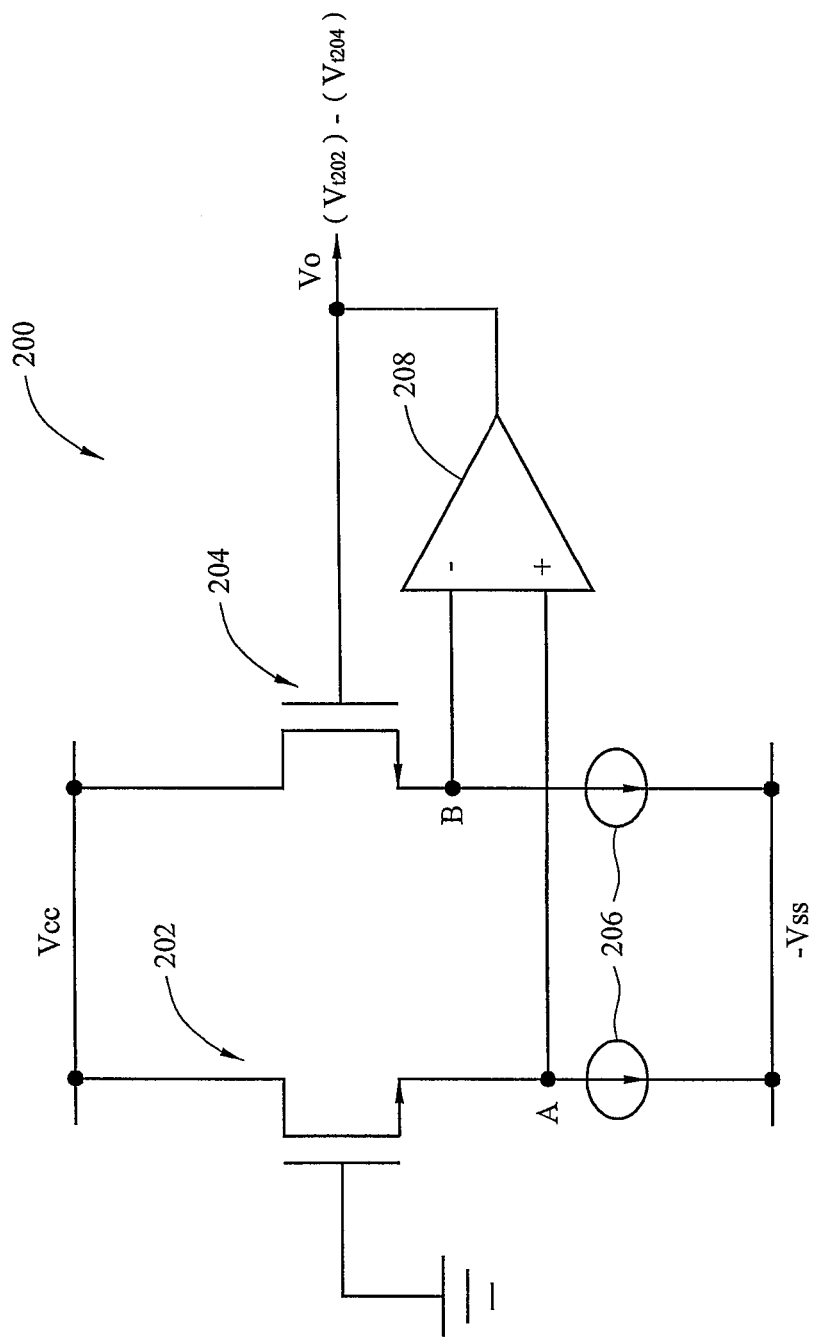
FIG. 8 is a schematic representation of a prior art 2-MOSFET voltage reference implemented with conventional n-MOSFETs, according to Gray and Meyer.

FIG. 8 is a prior art voltage reference source 200 according to Gray and Meyer, supra. The voltage source is implemented with two similar n-MOSFETs 202 and 204 having different threshold voltages $V_{t202}$ and $V_{t204}$, for example, because they have received different channel implants or because their polysilicon gate electrodes have received different doping. The voltage reference source 200 includes identical current sources 206 connected to the sources of the n-MOSFETs. The gate of the n-MOSFET 202 is grounded and its drain is connected to $V_{cc}$. The inverting input of an op-amp 208 is connected to the drain of the n-MOSFET 204 and the non-inverting input is connected to the drain of the n-MOSFET 202. The output of the op-amp 208 is connected to the gate of the n-MOSFET 204 to maintain the n-MOSFET 204 "on" and is also connected to an output $V_o$. The output $V_o$ is $V_{t202}$-$V_{t204}$ (i.e., $\Delta V_t$).

This voltage reference source 200 is widely used in CMOS VLSI and can be expediently implemented with p-MOSFETs.

GIDL Voltage Source

Figure 9A:
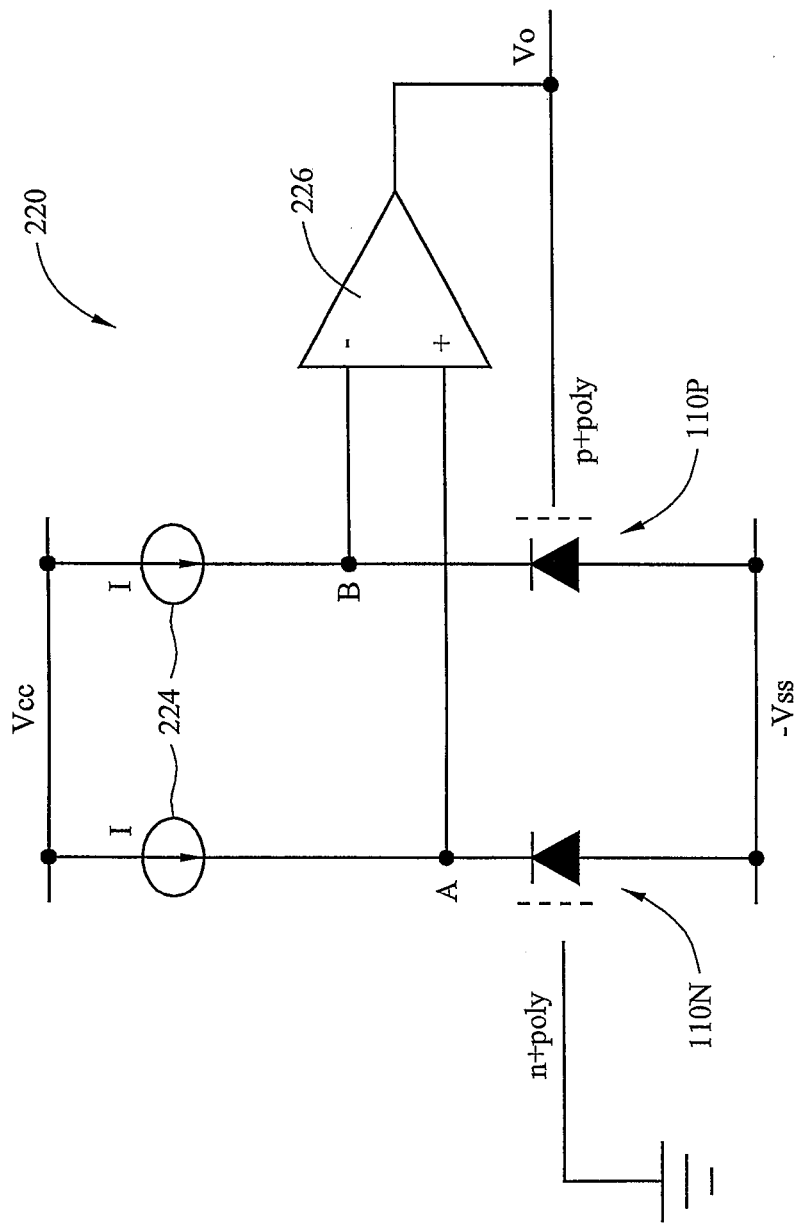
FIG. 9 depicts an improvement of the voltage reference of FIG. 8 and includes FIG. 9A, which is a voltage reference including two GIDL gated diodes of the type shown in FIG. 4A.
FIG. 9B, which is a voltage reference including two GIDL gated diodes of the type shown in FIG. 4B. In each of FIGS. 9A and 9B the gate electrodes of the two diodes are oppositely doped polysilicon and the output reference voltage is offset from ground, positively or negatively, by one bandgap in silicon, or 1.12 volts.
Figure 9B:
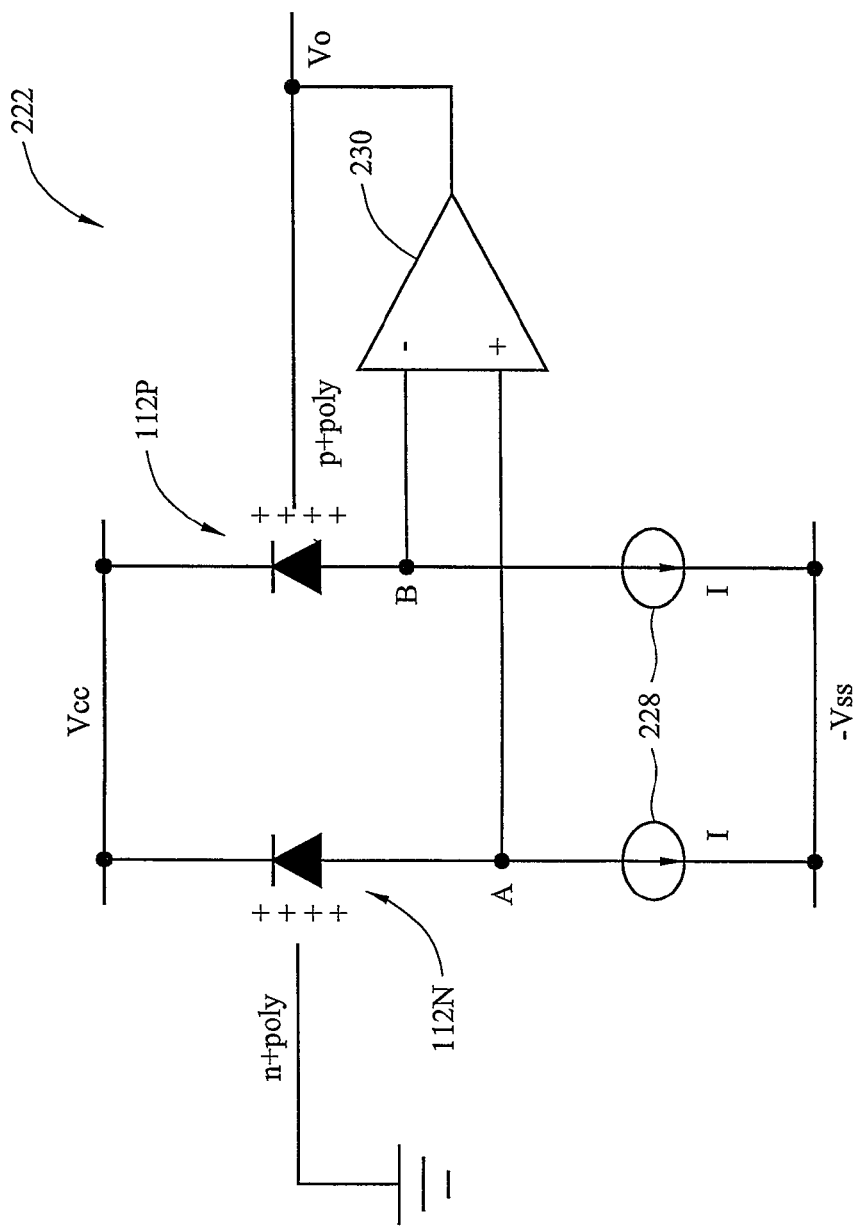

FIGS. 9A and 9B depict two embodiments 220 and 222 of a GIDL voltage reference source. Before discussing the voltage sources 220 and 222, there is discussed the threshold voltage at which GIDL gated diodes 110 and 112 (FIGS. 4A and 4B) turn "on."

Figure 10A:
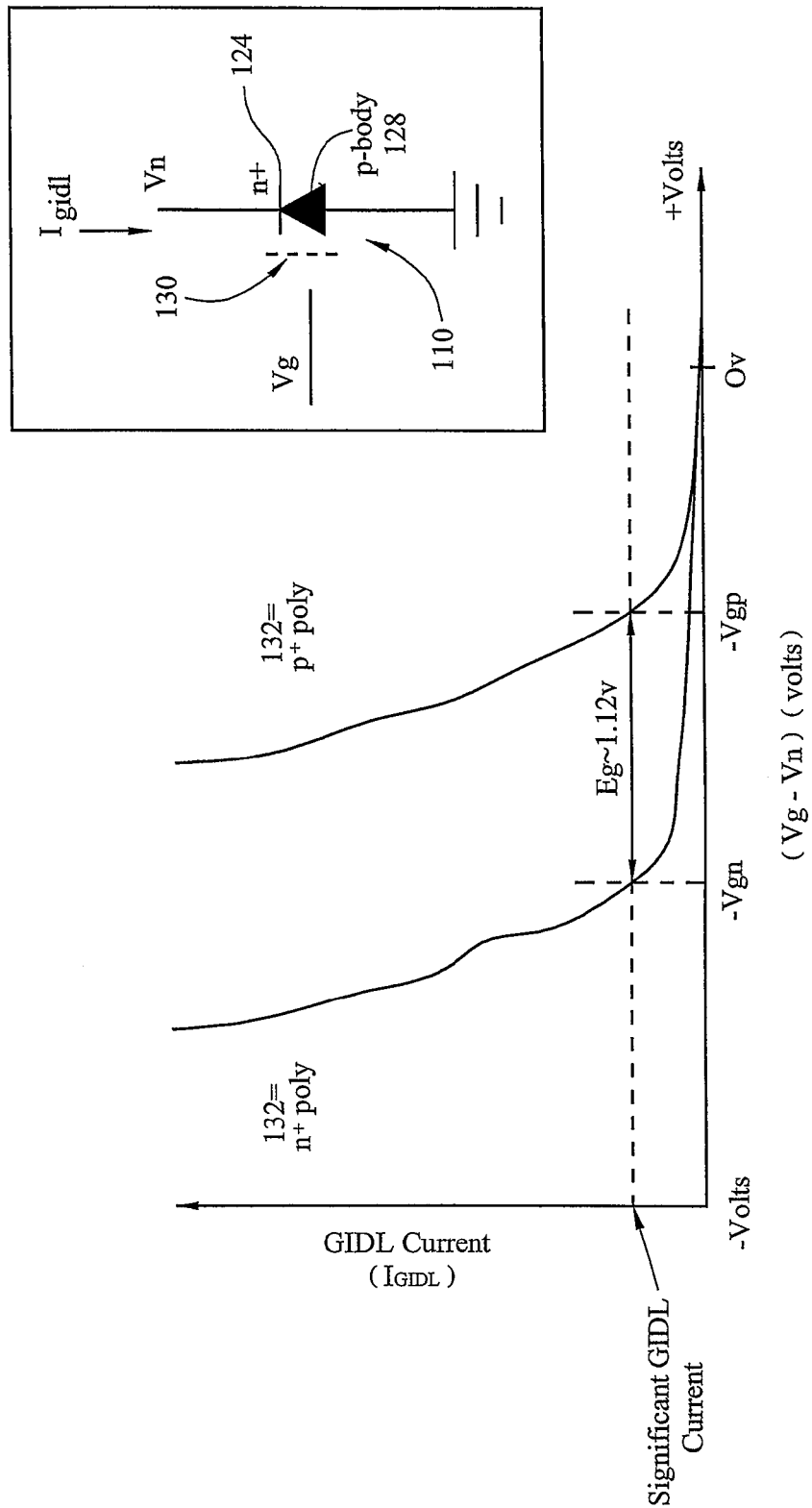
FIG. 10 includes FIG. 10A, which is a graph of the voltage versus GIDL current of the gated diode used in the voltage reference of FIG. 9A.
FIG. 10B, which is a similar graph of a gated diode of the type shown in FIG. 9B.

Initial reference is made to FIGS. 4A and 10A where the gated diode 110 is depicted. In the earlier description of the gated diode 110, it was noted that the polysilicon gate electrode 132 is preferably doped to the same polarity, p, as that of the body 128 to create a built-in, automatic electric field in the gate dielectric 134, which encourages the initiation of GIDL current. A priori, doping the gate electrode oppositely from the p-body 128 inhibits the initiation of GIDL current. That is, as shown in FIG. 10A, a diode 110 having a p-doped gate electrode 132 turns "on" or begins to conduct significant GIDL current at a negative voltage designated $-V_{gp}$ (where "gp" means the gate electrode 132 is doped with a p-type dopant). A diode 110 having an n-doped gate electrode 132 turns "on" at a more negative voltage designated $-V_{gn}$ (where "gn" means that the gate electrode is doped with an n-type dopant). The difference ($E_g$) between $-V_{gp}$ and $-V_{gn}$ is one band-gap in silicon, or approximately 1.12 volts. Compare FIG. 16-A1 through A3 with FIG. 16-C1 through C3.

Figure 10B:
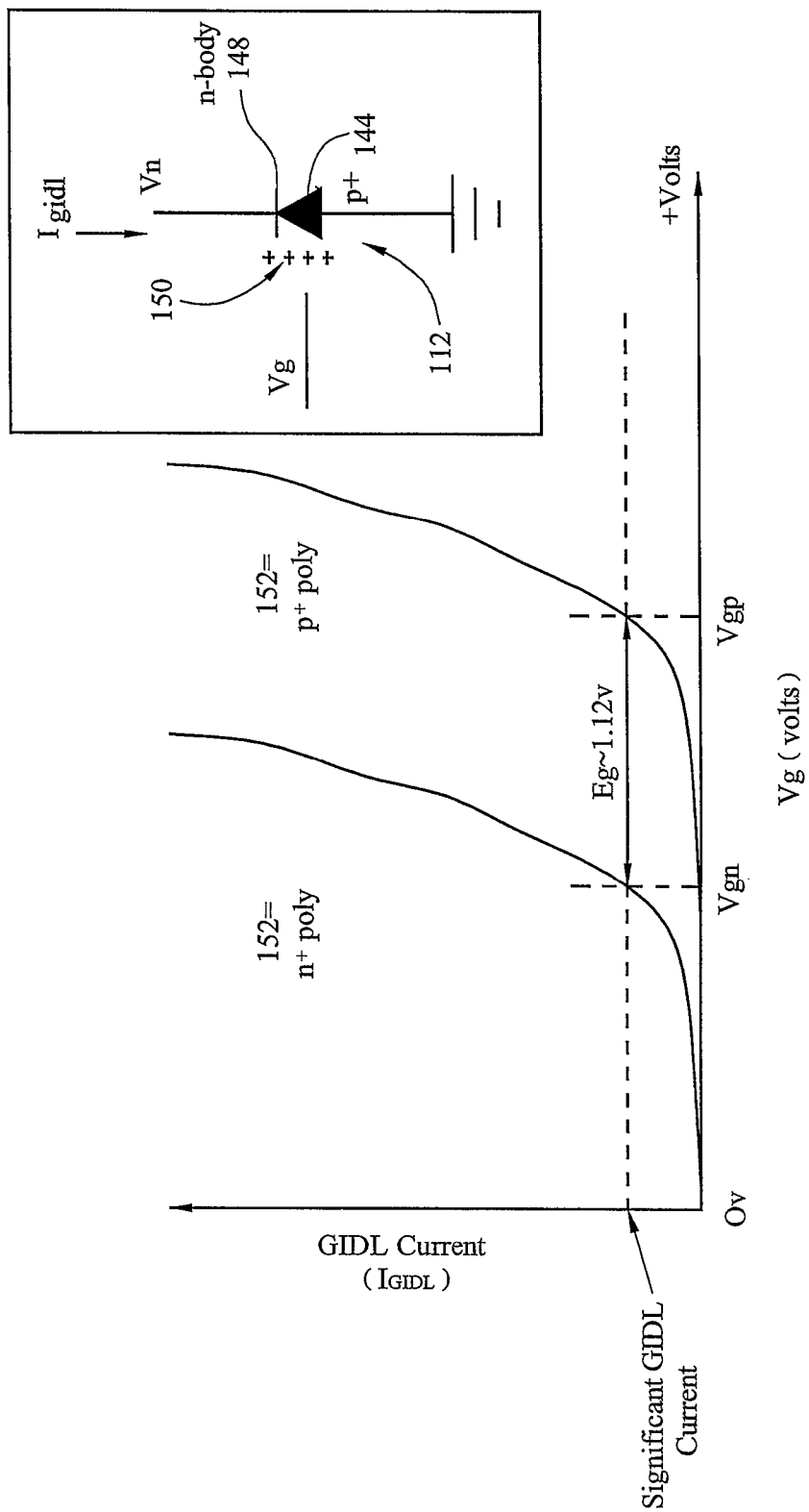

Similarly, referring to FIGS. 10B and 4B, a diode 112 having a heavily n-doped gate electrode 152 turns "on" at a positive voltage designated $V_{gn}$. If the diode 112 has a heavily p-doped gate electrode 152, it turns "on" at a higher positive voltage $+V_{gp}$. The difference ($E_g$) between $+V_{gp}$ and $+V_{gn}$ is one band-gap in silicon, again, approximately 1.12 volts.

For purposes of the following discussion, and referring to FIGS. 9A and 9B, the diode 110 with a heavily p-doped polysilicon gate electrode 132 is designated 110P; the diode 110 with its gate electrode heavy negatively doped is designated 110N. Both gated diodes 110P and 110N are turned "on" by a negative voltage on the gate electrode 132. Similarly, the diode 112 having a heavily n-doped gate electrode 152 is designated 112N; if its gate electrode 152 is heavily p-doped, the diode is designated 112P. Both gated diodes 112N and 112P are turned "on" by a positive voltage on the gate electrode 152.

FIG. 9A depicts the GIDL voltage reference source 220 that has a configuration similar to FIG. 8, but with the MOSFETs 202 and 204 of FIG. 8 replaced with gated diodes 110P and 110N. The gated diodes 110P and 110N are each connected in series with a current source 224, the current sources 224 producing the same magnitude current, and between $V_{cc}$ and $-V_{ss}$, the latter being connected to the anodes of the diodes 110P and 110N. The gate of the diode 110N is grounded. The gate of the diode 110P is connected to the output of an op-amp 226, which is the output $V_o$. The inverting input of the op-amp 226 is connected between the current source 224 and the cathode of the diode 110P. The non-inverting input of the op-amp 226 is connected between the current source 224 and the cathode of the gated diode 110N. The output of the reference 220 is one band-gap in silicon or approximately +1.12 volts. If the doping polarity of the gate electrodes 132 is reversed, or if the inputs of the op-amp 226 are swapped, the output $V_o$ is approximately −1.12 volts.

Similarly, in FIG. 9B, the MOSFETs 202 and 204 of FIG. 8 are replaced with gated diodes 112N and 112P. The gated diodes 112P and 112N are each connected in series with a current source 228, the current sources 228 producing the same magnitude current, and between $V_{cc}$ and $-V_{ss}$, the former being connected to the cathodes of the diodes 112P and 112N. The gate of the diode 112N is grounded. The gate of the diode 112P is connected to the output of an op-amp 230, which is the output $V_o$. The inverting input of the op-amp 230 is connected between the current source 228 and the anode of the diode 112P. The non-inverting input of the op-amp 230 is connected between the current source 228 and the anode of the gated diode 112N. The output of the reference 222 is one band-gap in silicon or approximately +1.12 volts. If the doping polarity of the gate electrodes 152 is reversed, or if the inputs of the op-amp 230 are swapped, the output $V_o$ is approximately −1.12 volts.

Figure 11A:
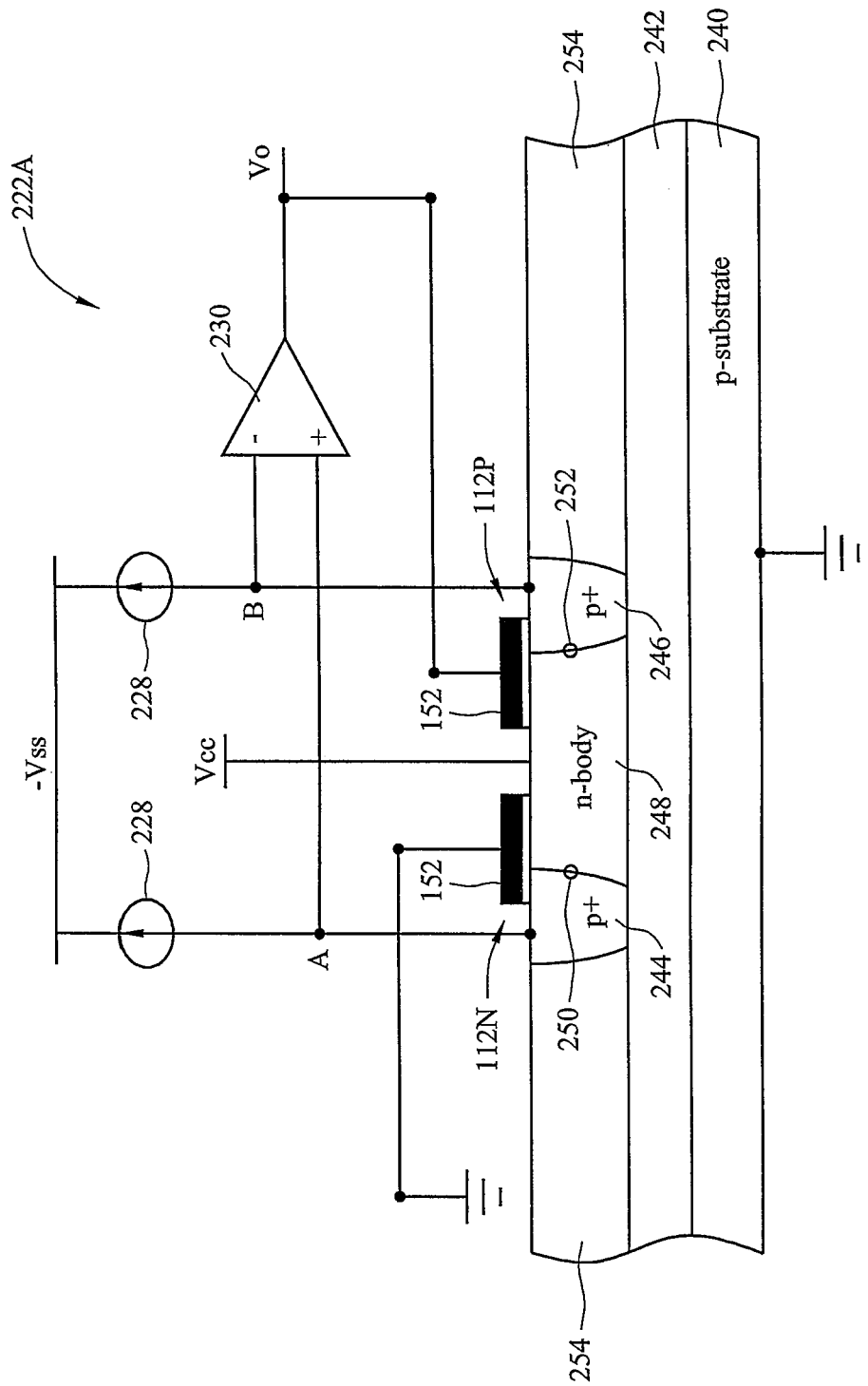
FIG. 11 includes FIG. 11A, which shows an SOI-implemented voltage reference as a combination of (a) a sectioned view of two GIDL gated diodes of the type shown in FIG. 4B, the GIDL gated diodes having their polysilicon gate electrodes oppositely doped and being fabricated according to SOI protocols and (b) an electrical schematic of other circuit elements connected to the GIDL gated diodes to complete the voltage reference.
FIG. 11B, which is similar to FIG. 11A but wherein the GIDL gated diodes are fabricated in bulk semiconductor.
Figure 11B:
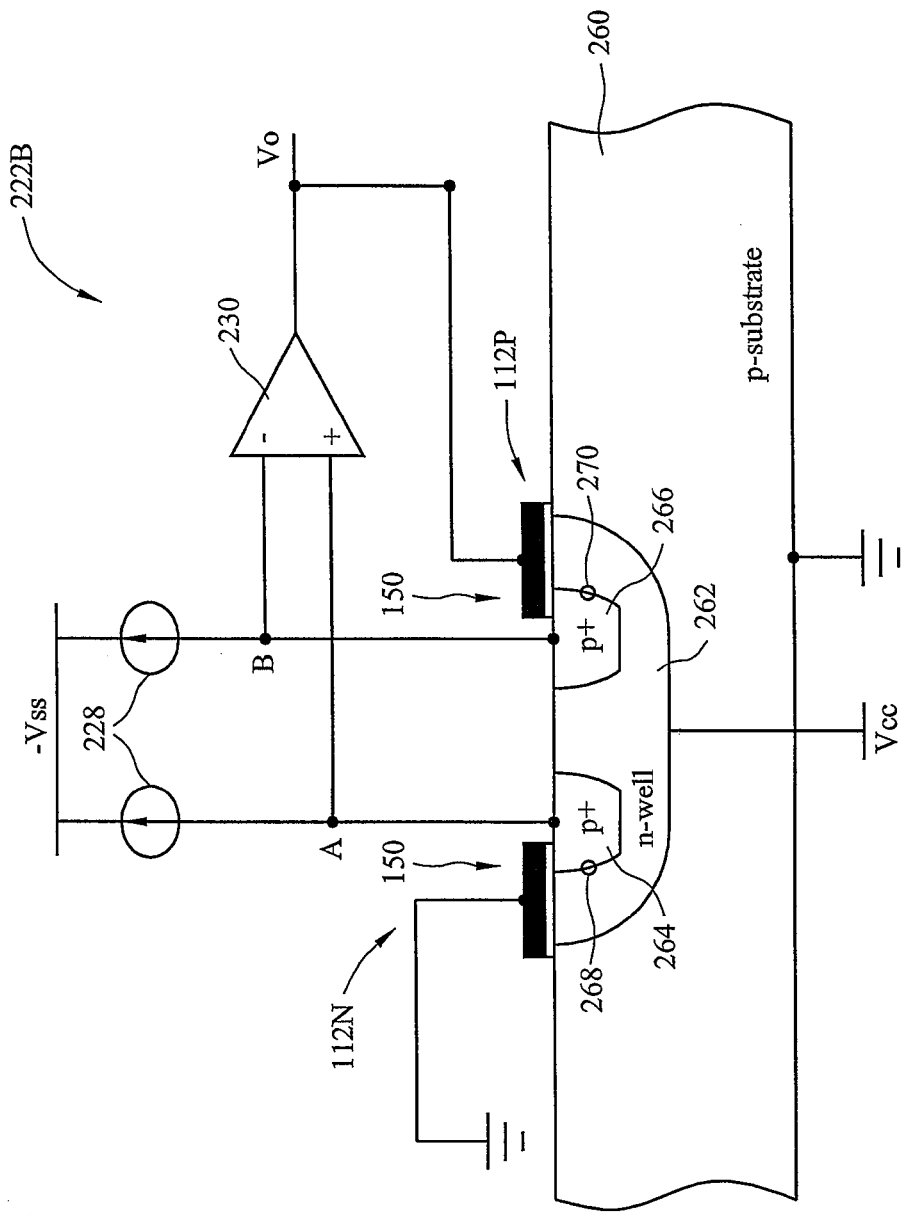

FIGS. 11A and 11B depict, respectively, an SOI implementation 222A and a bulk implementation 222B of the voltage reference source 222 shown in FIG. 9B. In FIG. 11A, a grounded p-substrate 240 carries a BOX layer 242 on which are formed two p+ regions 244 and 246 and an intervening n-body 248, creating two boundaries or junctions 250 and 252. STI 254 isolates the p+ regions 244 and 246. At the surface of the n-body 248 the boundaries 250 and 252 lie beneath respective gates 150, each having a gate electrode 152. The left-hand gate electrode 152 is heavily n-doped polysilicon, and the right-hand gate electrode 152 is heavily p-doped polysilicon. Thus, the combination of the heavily n-doped polysilicon gate 152 overlying the boundary 250, the p+ region 244, and the n-body 248 corresponds to the gated diode 112N in FIG. 9B. Similarly, the heavily p-doped gate 152 overlying the boundary 252, the p+ region 246, and the n-body 248 constitute the gated diode 112P of FIG. 9B. The remainder of the voltage reference 222A and its gated diodes 112N and 112P in FIG. 11A, and the operation thereof, are otherwise the same as in FIG. 9B.

FIG. 11B is a bulk-implemented version 222B of the SOI-implemented reference shown in FIG. 11A. The reference 222B includes a grounded bulk p-substrate 260 in which is formed an n-well 262 connected to $V_{cc}$. Two p+ regions 264 and 266 are formed in the n-well 262, creating two boundaries or junctions 268 and 270. Respective gates 150 overlie the junctions 268 and 270. The left-hand gate 150 is grounded and comprises n-doped polysilicon, thus completing the gated diode 112N. The right-hand gate is connected to the output of the op-amp 230 and comprises p-doped polysilicon. The remaining circuitry and operation of the reference 222B is otherwise the same as that of FIG. 11A.

Prior Art Neuron-FET Voltage Reference

Figure 12:
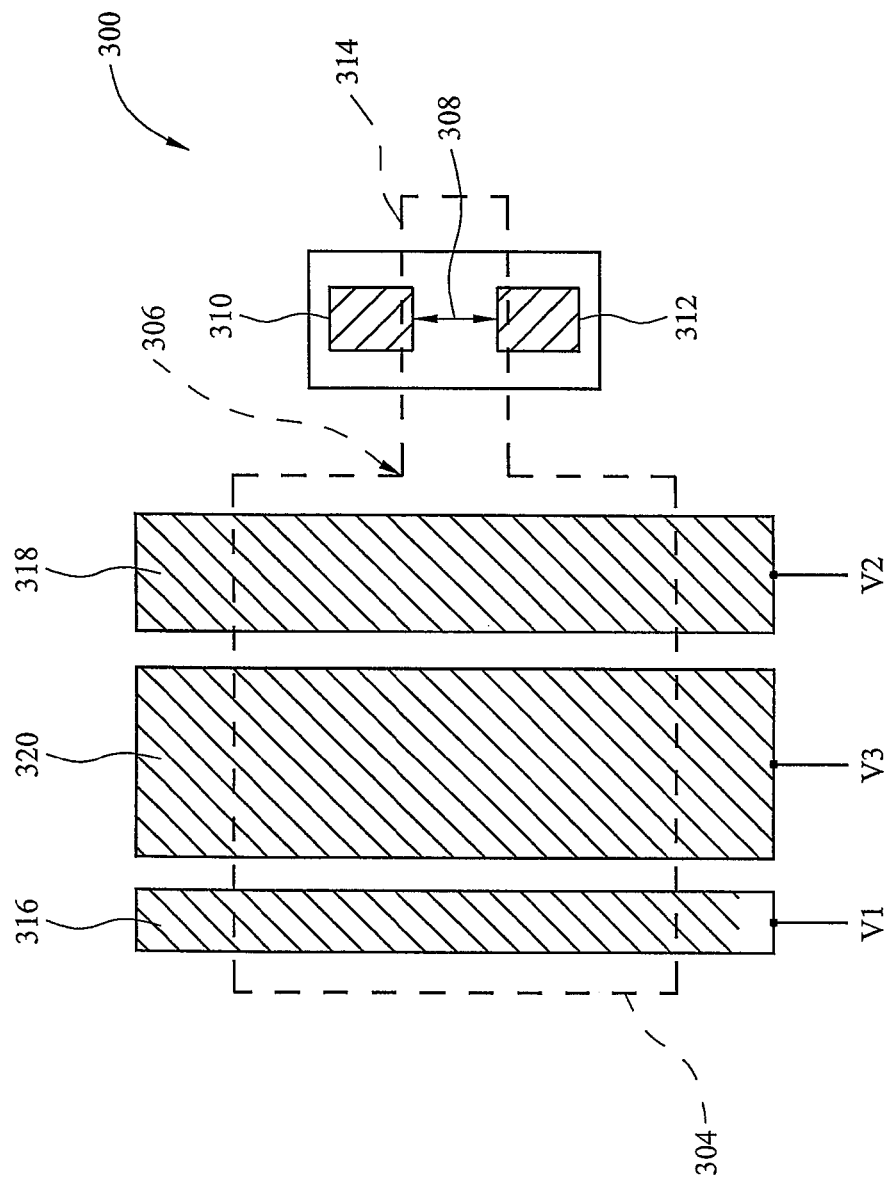
FIG. 12 is a top, generalized layout of a prior art neuron-FET.
Figure 13:
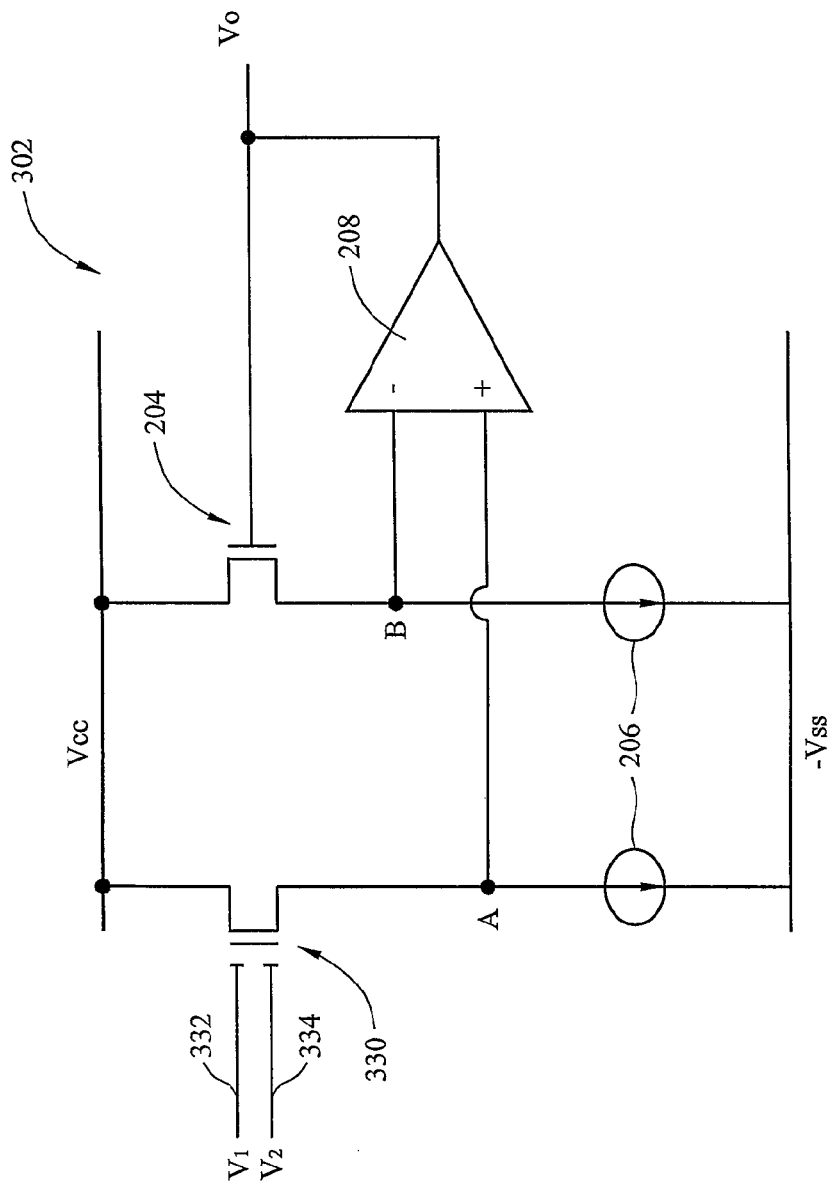
FIG. 13 is a schematic representation of a 2-MOSFET voltage reference according to the '780 patent in which one conventional MOSFET of the prior art inverter shown in FIG. 8 is replaced with a neuron-MOSFET of the type shown in FIG. 12.

FIGS. 12 and 13 are, respectively, a simplified top view depiction of the layout of a neuron-MOSFET 300 and a schematic representation of a neuron-MOSFET-implemented voltage reference source 302 after Shibata and Ohmi and the '780 patent.

The neuron-MOSFET 300 is, except for a modified and extended portion 304 of its gate structure 306, conventional. The MOSFET includes a channel 308 defined between a source 310 and a drain 312. A gate electrode 314 overlies the channel 308 and effects or prevents conduction between the source/drain 310/312 depending on the voltage applied thereto. The gate electrode 314 is insulated from the channel 308 by a gate dielectric (not shown in FIG. 12). To the side of the gate 314, the gate structure 306 comprises an extended and enlarged conductive portion 304 electrically continuous with the gate 314. The gate 314 and the enlargement 304 may be formed in a single deposition step pursuant to CMOS protocols.

Overlying, overlapping and insulated from the enlargement 304 are two or more (here three) side-by-side input electrodes 316, 318, 320 each forming a parallel plate capacitor with the enlargement 304. Respective voltages $V_1, V_2, V_3$ may be applied to the electrodes 316, 318, 320.

The electrodes 316, 318, 320 (shown as hatched in FIG. 12) each have a coupling area $A_1, A_2, A_3$ (shown cross-hatched in FIG. 12) that is superpositionally coincident with a congruent area of the enlargement 304. The total area $A_T$ of the enlargement 304 that is capacitively coupled to the input electrodes equals $A_1+A_2+A_3$. Coupling ratios $R_1, R_2, R_3$ are respectively defined as $A_1/A_T, A_2/A_T, A_3/A_T$, and $R_1+R_2+R_3=1$, assuming that stray capacitances associated with the gate 306 and its extension area 304 are negligible compared to the capacitances realized by the coupling areas A1, A2 and A3.

Thus, at any given time, the total potential $V_g$ of the enlargement 304 and, therefore, of the gate electrode 314 is $V_1R_1+V_2R_2+V_3R_3$, the weighted sum of the voltages applied to the input electrodes 316, 318, 320. When $V_g$ has a sufficient magnitude, conduction occurs between the source 310 and the drain 312 through the channel 308, and the neuron-MOSFET 300 is turned "on" or is "fired."

A neuron-MOSFET, therefore operates in a "if sufficient weighted sum, then fire" mode, which is said to mimic the "firing" of a neuron of the human brain.

The coupling areas $A_1, A_2$ and $A_3$ and the coupling ratios $R_1, R_2$ and $R_3$ may all be different, as shown in FIG. 12. Some or all of them may also be equal.

FIG. 13 shows a voltage reference source 302, which is similar to the voltage reference source 200 shown in FIG. 8, except as follows. First, the MOSFET 202 of FIG. 8 has been replaced by a two-input neuron-MOSFET 330, in which each input voltage $V_1$ and $V_2$ is applied to a respective one of the input electrodes 332, 334. Clearly, more than two inputs may be present. Second, the channel implants and the doping of the gates of the FETs 204 and 330 are similar, so that the threshold voltage $V_t$ of each device 204 and 330 is the same. Taking the coupling ratio (R, as defined above) of the input electrodes 332 and 334 to be $R_1$ and $R_2$, respectively, the output $V_o$ of the voltage reference 302 is given by $(V_1R_1+V_2R_2)$. If $V_t$ of the MOSFETs 204 and 330 are not the same, and their $V_t$'s vary by X, then $V_o$ will be given by $(V_1R_1+V_2R_2)\pm X$.

Gated GIDL Neuron-Diode

Figure 14A:
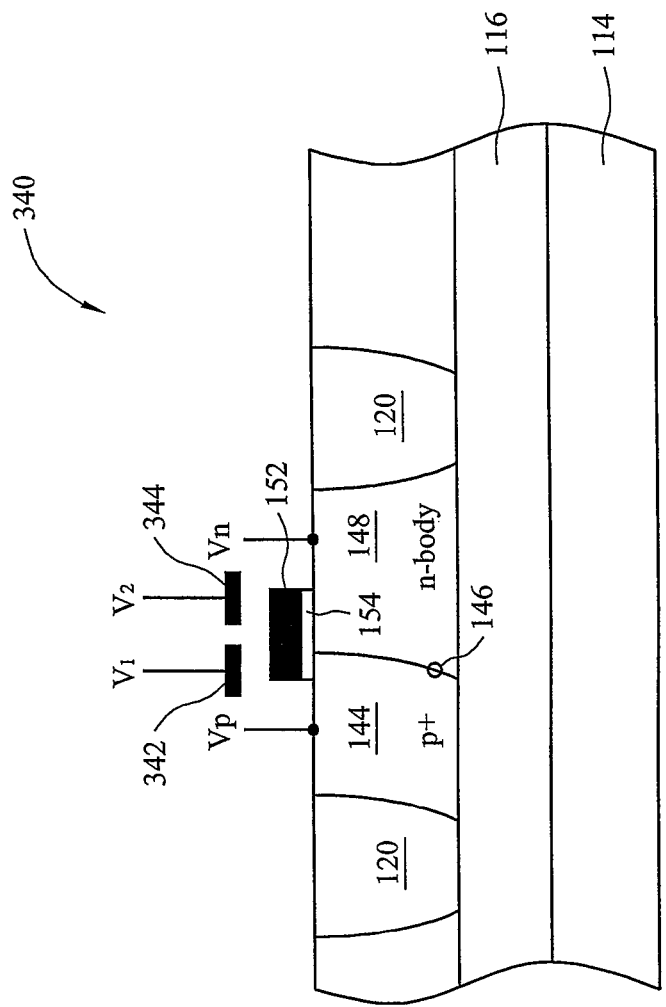
FIG. 14 includes FIG. 14A, which is a sectioned view of an SOI-implemented neuron-MOSFET based on the gated diode of FIG. 4B.
FIG. 14B, which is a schematic representation of the neuron FET of FIG. 14A, including the notation therefore.
FIG. 14C, which generally depicts the layout of the neuron-MOSFET of FIG. 14A.

FIG. 14A shows a schematic of a 2-input gated GIDL neuron-diode 340 comprising a gated GIDL diode of the type shown in FIG. 4B with its gate electrode 152 being modified along the lines of FIG. 12. $V_1$ and $V_2$ may be respectively applied to input electrodes 342 and 344, which added to the gate electrode 152 of FIG. 4B. The diode 340 will operate according to the GIDL effect if the weighted sum $V_1R_1+V_2R_2$ is sufficiently high to initiate band-to-band tunneling of electrons followed by the consequent movement of the electrons from the p+ region 150 to the n-body 148. $R_1$ and $R_2$ are defined in the previous section hereof.

Figure 14B:
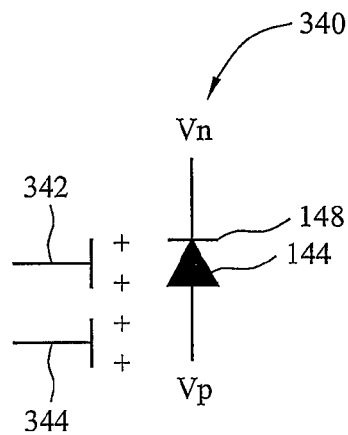
Figure 14C:
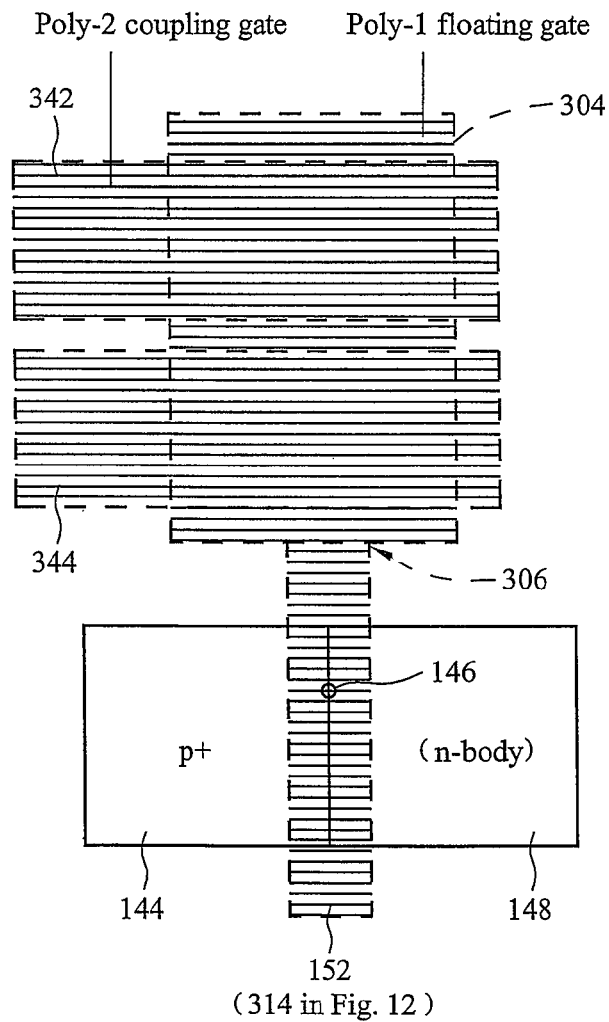

FIG. 14B is a schematic of the two-input gated GIDL neuron-diode 340 that is similar to the schematic of FIG. 4B, the latter representing the single-input logic switch 112. FIG. 14C is a layout of the diode 340 in which the coupling areas and the coupling ratios $R_1$ and $R_2$ of the input electrodes 342 and 344 with the enlargement 304 are, for purposes of illustration, equal. From the earlier discussion, it should be clear that more than two inputs may be present, and, in the two-input case, the coupling ratios $R_1$ and $R_2$ need not be equal.

Voltage Reference Using Gated GIDL Neuron-Diode

Figure 15:
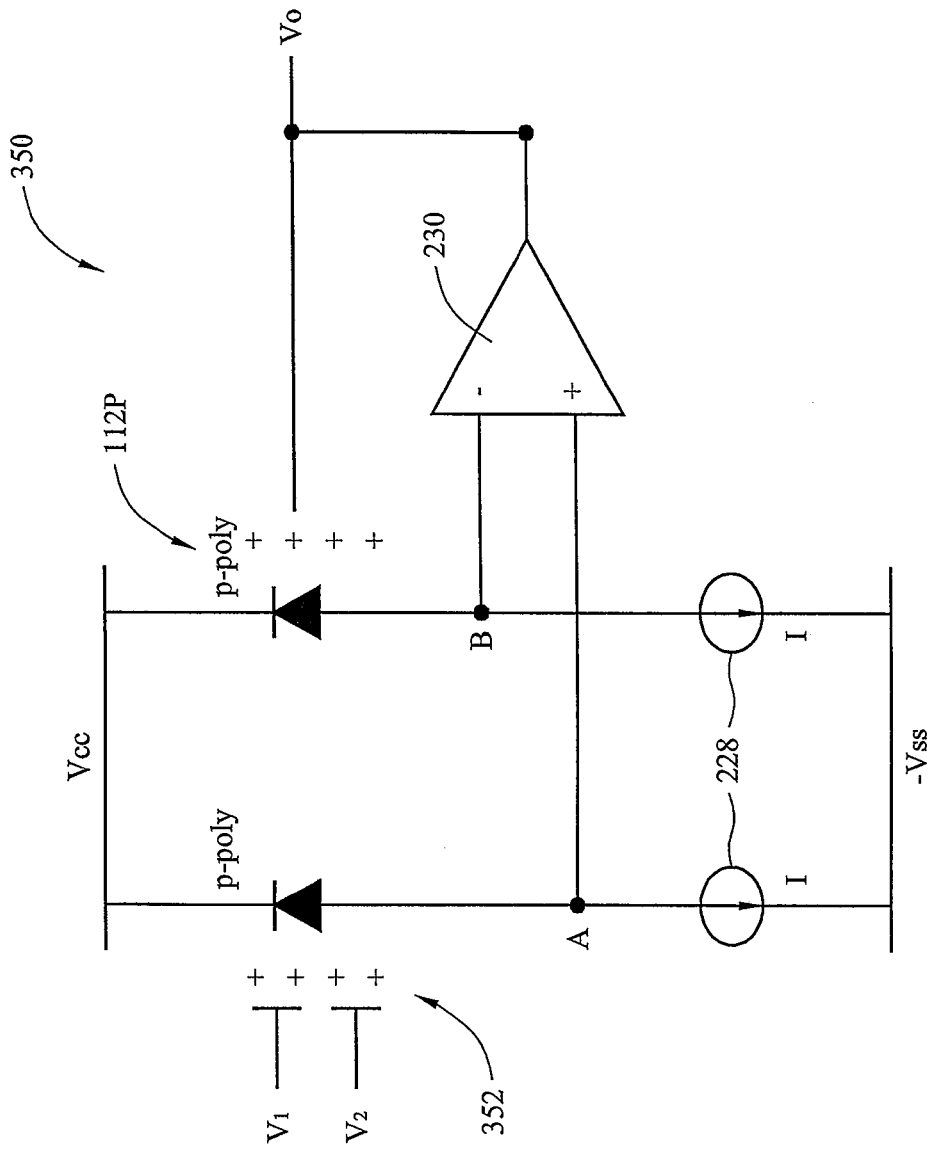
FIG. 15 is a schematic representation of a voltage reference similar to that of FIG. 8 but in which one of the conventional MOSFETs is replaced with the neuron-MOSFET of FIG. 14.

FIG. 15 is a schematic of a voltage reference source 350, in which the gated diode 112N of FIG. 9B has been replaced by a 2-input neuron-diode 352, the polysilicon gate 152 of which is doped p+. The gated diode 112P of FIG. 9B is the same as the gated diode 4B with the gate 152 comprising p-polysilicon. The remainder of the voltage reference source 350 is otherwise the same as the voltage reference source 222 in FIG. 9B.

The 2-input neuron diode 352 may be extended to a 3-input neuron diode (not shown in FIG. 15), by substituting the layout of FIG. 12 for the layout of FIG. 14C. In this event, the diode 352 has three inputs $V_1$, $V_2$ and $V_3$, and the output $V_o=V_1R_1+V_2R_2+V_3R_3$. The added third input $V_3$ may be used as a fine tuning control to shift $V_o$ by an amount $V_3R_3$.

In FIG. 14C, the input electrodes 342 and 344 are shown as having the same coupling area to the enlargement 304 (and, accordingly the same R), and the levels of $V_o$ in FIG. 15 are uniformly spaced in descending or ascending order. If the input electrodes 342 and 344 have unequal areas, or if the layout of FIG. 12 replaces the layout of FIG. 14C as the electrode structure of the voltage reference 350, $R_1$ and $R_2$, in the first case, and $R_1$, $R_2$ and $R_3$, in the second case, are all different, and the output levels of $V_o$ (in FIG. 15) are non-uniformly spaced in ascending or descending order.

Numerical examples of the foregoing are presented in TABLE 1, below. The values for $V_1, V_2$ and $V_o$ at the upper left of the TABLE relate to the voltage reference source 350 containing the 2-input neuron-diode 352, where, as in FIG. 14, the coupling areas of the input electrodes 342 and 344 are the same, and $R_1=R_2=0.5$. Treating the values $V_1=0, V_2=\pm V_{cc}$ as the equivalent of $V_1=\pm V_{cc}, V_2=0$, $V_o$ assumes the evenly spaced values of 0, $\pm V_{cc}/2$ and $\pm V_{cc}$. At the lower left of the TABLE, a 2-input reference uses $R_1=\frac{2}{3}$ and $R_2=\frac{1}{3}$, with $V_o$ assuming the values shown. At the right of the TABLE, the 3-input structure of FIG. 12 is used, and $V_1=0.2, V_2=0.3$ and $V_3=0.5$.

TABLE 1

| | | | $r_1 = 0.2; r_2 = 0.3; r_3 = 0.5$ | | | |
|---|---|---|---|---|---|---|
| $v_1$ | $v_2$ | $v_o$ | $V_1$ | $V_2$ | $V_3$ | $V_o$ |
| $r_1 = r_2 = 0.5$ | | | $V_{cc}$ | $V_{cc}$ | $V_{cc}$ | $V_{cc}$ |
| $V_{cc}$ | $V_{cc}$ | $V_{cc}$ | 0 | $V_{cc}$ | $V_{cc}$ | $0.8\,V_{cc}$ |
| $V_{cc}$ | 0 | $V_{cc}/2$ | $V_{cc}$ | | $V_{cc}$ | $0.7\,V_{cc}$ |
| 0 | $V_{cc}$ | $V_{cc}/2$ | $V_{cc}$ | $V_{cc}$ | 0 | $0.5\,V_{cc}$ |
| 0 | 0 | 0 | 0 | 0 | $V_{cc}$ | $0.5\,V_{cc}$ |
| $-V_{cc}$ | 0 | $-V_{cc}/2$ | 0 | $V_{cc}$ | 0 | $0.3\,V_{cc}$ |
| 0 | $-V_{cc}$ | $-V_{cc}/2$ | $V_{cc}$ | 0 | 0 | $0.2\,V_{cc}$ |
| $-V_{cc}$ | $-V_{cc}$ | $-V_{cc}$ | 0 | 0 | 0 | 0 |
| $r_1 = 2/3; r_2 = 1/3$ | | | $-V_{cc}$ | 0 | 0 | $-0.2\,V_{cc}$ |
| $V_{cc}$ | $V_{cc}$ | $V_{cc}$ | 0 | $-V_{cc}$ | 0 | $-0.3\,V_{cc}$ |
| $V_{cc}$ | 0 | $2V_{cc}/3$ | 0 | 0 | $-V_{cc}$ | $-0.5\,V_{cc}$ |
| 0 | $V_{cc}$ | $V_{cc}/3$ | $-V_{cc}$ | $-V_{cc}$ | 0 | $-0.5\,V_{cc}$ |
| 0 | 0 | 0 | $-V_{cc}$ | 0 | $-V_{cc}$ | $-0.7\,V_{cc}$ |

TABLE 1-continued

| | | | $r_1 = 0.2; r_2 = 0.3; r_3 = 0.5$ | | | |
|---|---|---|---|---|---|---|
| $v_1$ | $v_2$ | $v_o$ | $V_1$ | $V_2$ | $V_3$ | $V_o$ |
| $-V_{cc}$ | 0 | $-2V_{cc}/3$ | 0 | $-V_{cc}$ | $-V_{cc}$ | $-0.8V_{cc}$ |
| 0 | $-V_{cc}$ | $-V_{cc}/3$ | $-V_{cc}$ | $-V_{cc}$ | $-V_{cc}$ | $-V_{cc}$ |
| $-V_{cc}$ | $-V_{cc}$ | $-V_{cc}$ | | | | |

CONCLUSION

The foregoing Detailed Description relates to GIDL gated diodes 110 and 112; GIDL gated diode inverters 160 and 180; GIDL gated diode SRAMs 190 and 192; GIDL gated diode voltage references 220 and 222; a GIDL gated neuron-diode 340; and a GIDL gated neuron-diode voltage reference 350. When compared to their conventional FET-based counterparts, these circuits 160, 180, 190, 192, 220, 222, 340 and 350, all of which utilize GIDL gated diodes 110 and 112, and such gated diodes 110 and 112 themselves possess, inter alia, the following advantages:

(a) Outputs are more stable and less noisy, because GIDL gated diodes do not suffer from the disadvantages resulting from the floating body effect. Every node in a circuit based on GIDL gated diodes is connected;

(b) The operation of GIDL gated diode-based circuits is less temperature-sensitive. Band-to-band tunneling, a primary mechanism of GIDL, is only slightly, if at all, sensitive to temperature;

(c) Circuits using gated diodes functioning pursuant to the GIDL effect are more power-efficient. GIDL: gated diodes do not exhibit parasitic bipolar action or MOS action because GIDL gated diodes possess neither the forward-biasing of pnp or npn structures nor parasitic MOS channels. Leakage current is essentially non-existent because MOS "off" current is not present and GIDL current totally ceases to flow after diode "turn-off."

(d) The IC fabrication of the disclosed circuits is simplified because fewer fabrication requirements and steps are involved. For example, spacer formation and LDD implantation are not required, and the polysilicon gate electrodes are not critical dimension-sensitive; and (e) The layout dimensions are relatively smaller because there are fewer constituent elements. No source (or source diffusion) is necessary because there is present only one junction or boundary, between a "drain" and a body in which the drain is formed.

Although the GIDL gated diode of the present invention and its advantages, both per se and in circuits utilizing the gated diode, have been described in detail, it should be understood that various changes, substitutions and alterations can be made therein without departing from the spirit and scope of the invention as defined by the appended claims. Moreover, the scope of the present document is not intended to be limited to the particular embodiments of the GIDL gated diode and circuits containing it as described in the specification. As one of ordinary skill in the art will readily appreciate from the disclosure of the present invention, GIDL gated diodes and circuits utilizing same that presently exist or are later developed, and that perform substantially the same function or achieve substantially the same result as the corresponding embodiments described herein, may be utilized according to and are covered by the present invention, and are intended to be included within the scope of the appended claims.

What is claimed is:

1. A method of forming a logic switch, comprising:
    forming a first semiconductor region of a first conductivity type, the first semiconductor region being a low-doped region;
    forming a second semiconductor region of a second conductivity type adjacent to the first semiconductor region, the second semiconductor region being a highly-doped region, and a pn junction defined between the first and second semiconductor regions; and
    forming a gate overlying the pn junction and immediate junction-adjacent surfaces of the first and second semiconductor regions, the forming the gate comprising:
        forming a thin oxide layer on a surface of the first and second semiconductor regions; and
        forming a conductive gate electrode on the thin oxide layer, the conductive gate electrode having a first edge overlying an uppermost surface of the first semiconductor region and a second edge overlying an uppermost surface of the second semiconductor region, the conductive gate electrode being highly-doped with a dopant of the first conductive type.

2. The method of claim 1, further comprising:
    forming a buried oxide (BOX) layer on a semiconductor substrate; and
    forming a semiconductor layer on the BOX layer, a diode site defined in an enclosed volume of the semiconductor layer between a free surface thereof and the BOX layer, the enclosed volume being electrically isolated from a remainder of the semiconductor layer, wherein the second semiconductor region is formed in a portion of the enclosed volume, and the remainder of which is the first semiconductor region.

3. The method of claim 1, wherein forming the conductive gate electrode comprises doping the gate electrode with a dopant concentration sufficient to place the surface of said second semiconductor region under the gate in majority carrier depletion and the surface of said first semiconductor region under the gate in majority carrier accumulation, such conditions being, at thermal equilibrium and with no potential difference between the conductive gate electrode and the first and second semiconductor regions, conducive to a flow of gate-induced drain leakage (GIDL) current between the first and second semiconductor regions.

4. A method of forming a device, comprising:
    forming a first region of a first logic switch, the first region having a first conductivity type;
    forming a second region of the first logic switch adjacent to the first region, the second region having a second conductivity type, a first junction being defined between the first and second regions;
    forming a first gate of the first logic switch overlying the first junction, the forming the first gate comprising:
        forming a first thin oxide layer on a surface of the first and second regions, the first thin oxide layer having a first lateral edge over an uppermost surface of the first region and a second lateral edge over an uppermost surface of the second region; and
        forming a first gate electrode on the first thin oxide layer, the first gate electrode being highly-doped with a dopant of the first conductivity type, the first lateral edge and the second lateral edge being vertical to a plane formed by an interface between the first thin oxide layer and the first gate electrode;
    forming a third region of a second logic switch, the third region having the second conductivity type;

forming a fourth region of the second logic switch adjacent to the third region, the fourth region having the first conductivity type, a second junction being defined between the third and fourth regions; and forming a second gate overlying the second junction, forming the second gate comprising:

forming a second thin oxide layer on a surface of the third and fourth regions, the second thin oxide layer having a third lateral edge on the third region and a fourth lateral edge on the fourth region; and forming a second gate electrode on the second thin oxide layer, the second gate electrode being highly-doped with a dopant of the second conductivity type, the third lateral edge and the fourth lateral edge being vertical to a plane formed by an interface between the second thin oxide layer and the second gate electrode;

forming an electrical connection between the first and second gate electrodes;

forming separate electrical connections to the second and fourth regions, respectively; and forming an electrical connection between the first and third regions for producing an output voltage $V_o$ in response to application of an input.

5. The method of claim 4, further comprising forming a buried oxide (BOX) layer on a semiconductor substrate, wherein forming the first, second, third, and fourth regions comprises forming the first, second, third, and fourth regions over the BOX layer.

6. The method of claim 5, further comprising forming a semiconductor layer on the BOX layer, wherein forming the first, second, third, and fourth regions comprises forming the first, second, third, and fourth regions in the semiconductor layer.

7. The method of claim 4, further comprising forming an isolation region interposed between the first region and the third region.

8. The method of claim 4, further comprising forming the first region and the third region immediately adjacent to each other and forming a third junction between the first region and the third region.

9. The method of claim 8, further comprising a butting contact overlying the third junction.

10. The method of claim 4, further comprising:
electrically coupling the fourth region to $V_{ss}$; and
electrically coupling the second region to $V_{cc}$.

11. The method of claim 4, wherein forming the first gate, forming the first region, and forming the second region comprises forming the first gate, the first region and the second region such that a first input voltage permits gate induced drain leakage (GIDL) current flow bi-directionally between the first region and the second region, and such that a second voltage terminates GIDL current flow and forward biases the first junction and current flows uni-directionally between the first region and the second region, and such that a third voltage bi-directionally prevents current flow between the first region and the second region.

12. A method for forming a device comprising:
forming a first gate electrode overlying a first junction, the first junction being between a first highly doped region of a first conductivity type and a first body region of a second conductivity type, the first gate electrode overlying a portion of the first highly doped region, and less than the entire first highly doped region, and a portion of the first body region, a first insulator being interposed between the first gate electrode and the first junction;

forming a second gate electrode overlying a second junction, the second junction being between a second highly doped region of the second conductivity type and a second body region of the first conductivity type, a second insulator being interposed between the second gate electrode and the second junction, a second source region being in the second highly doped region and a second drain region being in the second body region;

forming a first electrical connection electrically coupled to the first gate electrode and the second gate electrode; and forming a second electrical connection electrically coupled to the first body region and the second body region.

13. The method of claim 12, further comprising forming a buried oxide (BOX) layer on a substrate, the first and second highly doped regions and the first and second body regions over the BOX layer.

14. The method of claim 13, further comprising forming a semiconductor layer on the BOX layer, the first and second highly doped regions and the first and second body regions formed in the semiconductor layer.

15. The method of claim 12, further comprising forming an isolation region interposed between the first body region and the second body region.

16. The method of claim 12, further comprising forming the first body region and the second body region abutting each other, thereby forming a third junction.

17. The method of claim 16, further comprising forming a butting contact overlying the third junction.

18. The method of claim 12, wherein forming the first gate comprises forming the first gate electrode such that a first input voltage initiates gate induced drain leakage (GIDL) current flow between the first highly doped region and the first body region and current can flow bi-directionally between the connections, such that a second voltage terminates GIDL current flow and forward biases the first junction so that current flows uni-directionally between the first highly doped region and the first body region, and such a third voltage bi-directionally prevents current flow between the first highly doped region and the first body region.

19. The method of claim 12, wherein forming the first gate electrode comprises forming a highly-doped first gate electrode with a dopant of the first conductivity type.

20. The method of claim 12, further comprising forming the first insulator over the first junction, the first insulator having a first lateral edge over an uppermost surface of the first highly doped region and a second lateral edge over an uppermost surface of the first body region.

* * * * *